US010396444B2

(12) United States Patent
Levy et al.

(10) Patent No.: US 10,396,444 B2
(45) Date of Patent: Aug. 27, 2019

(54) ANTENNA ASSEMBLY

(71) Applicant: Panasonic Avionics Corporation, Lake Forest, CA (US)

(72) Inventors: David Levy, Karmiel (IL); Brinder Bhatia, Trabuco Canyon, CA (US); Yair Shemesh, Haifa (IL); Michael Sigalov, Moshav Bat Shlomo (IL); Benjamin Engel, Haifa (IL); Amir Haber, Qiryat Bialik (IL); Paul Margis, Irvine, CA (US)

(73) Assignee: Panasonic Avionics Corporation, Lake Forest, CA (US)

( * ) Notice: Subject to any disclaimer, the term of this patent is extended or adjusted under 35 U.S.C. 154(b) by 226 days.

(21) Appl. No.: 15/499,746

(22) Filed: Apr. 27, 2017

(65) Prior Publication Data

US 2017/0331176 A1 Nov. 16, 2017

Related U.S. Application Data

(60) Provisional application No. 62/334,548, filed on May 11, 2016.

(51) Int. Cl.
*H01Q 1/28* (2006.01)
*H01Q 1/38* (2006.01)
(Continued)

(52) U.S. Cl.
CPC ................. *H01Q 1/28* (2013.01); *H01Q 1/38* (2013.01); *H01Q 3/34* (2013.01); *H01Q 9/0414* (2013.01); *H01Q 21/065* (2013.01); *H01Q 21/22* (2013.01)

(58) Field of Classification Search
CPC .. H01Q 1/28; H01Q 1/38; H01Q 3/34; H01Q 9/0414; H01Q 21/065; H01Q 21/22
See application file for complete search history.

(56) References Cited

U.S. PATENT DOCUMENTS 5,463,656 A 10/1995 Polivka et al.
6,512,487 B1 1/2003 Taylor et al.
(Continued)

FOREIGN PATENT DOCUMENTS

CN 103022726 4/2013

OTHER PUBLICATIONS

Fenn et al., The Development of Phased-Array Radar Technology, Lincoln Laboratory Journal, Jan. 2000, pp. 321-340, vol. 12, No. 2.
Michael Salter, Phased Array Antenna, RISE Acreo, Online Publication, downloaded Dec. 4, 2015, url: https://www.acreo.se/projects/phased-array-antenna#description.
Carlo Kopp, AEW&C—Phased Array Technology Parts 1 & 2, Air Power Australia, Sep., Oct. 1994, url: http://ausairpower.net/aew-aesa.html.
(Continued)

*Primary Examiner* — Dameon E Levi
*Assistant Examiner* — David E Lotter
(74) *Attorney, Agent, or Firm* — Brian Furrer

(57) ABSTRACT

An antenna assembly including a support and antenna tiles disposed in the support. The antenna tiles form an external surface corresponding substantially in shape to lateral faces of a frustum. The frustum includes a central axis with the antenna tiles disposed around the central axis of the frustum and sloping away therefrom. Each antenna tile includes opposite ends, with one end narrower than the other end. A planar array of antenna elements is disposed on each antenna tile in which the antenna elements of each array are configured to operate as a phased array. A control system connects to the planar arrays of antenna elements in which the control system is configured to selectively activate and deactivate each of the planar arrays.

20 Claims, 19 Drawing Sheets

(51) Int. Cl.

| | |
|---|---|
| ***H01Q 3/34*** | (2006.01) |
| ***H01Q 21/06*** | (2006.01) |
| ***H01Q 21/22*** | (2006.01) |
| ***H01Q 9/04*** | (2006.01) |

(56) References Cited

U.S. PATENT DOCUMENTS

| | | | | |
|---|---|---|---|---|
| 6,621,470 | B1 | 9/2003 | Boeringer et al. | |
| 6,774,848 | B2 | 8/2004 | Wright | |
| 6,958,729 | B1 | 10/2005 | Metz | |
| 7,522,095 | B1 | 4/2009 | Wasiewicz et al. | |
| 7,714,797 | B2 | 5/2010 | Couchman et al. | |
| 7,750,863 | B2 | 7/2010 | Wesel | |
| 7,940,228 | B1 | 5/2011 | Buckley | |
| 8,334,809 | B2 | 12/2012 | Nichols et al. | |
| 8,654,017 | B1 * | 2/2014 | Voss | H01Q 1/02 343/705 |
| 9,564,682 | B2 | 2/2017 | Rhoads et al. | |
| 2002/0050946 | A1 | 5/2002 | Chang et al. | |
| 2003/0020666 | A1 * | 1/2003 | Wright | H01Q 1/286 343/824 |
| 2006/0176843 | A1 | 8/2006 | Gat et al. | |
| 2011/0291889 | A1 | 12/2011 | Mayo | |
| 2013/0194134 | A1 | 8/2013 | Beeker et al. | |
| 2013/0273858 | A1 | 10/2013 | Sover et al. | |
| 2013/0297301 | A1 | 11/2013 | Alberth, Jr. | |
| 2014/0085143 | A1 * | 3/2014 | Chang | H01Q 21/205 342/371 |
| 2016/0049723 | A1 * | 2/2016 | Baks | H01L 23/49827 343/848 |

OTHER PUBLICATIONS

Ferdinando Tiezzi, Overview of Automotive Antennas for Satellite Mobile Communications, ARTIC Workshop, Apr. 15, 2010, Barcelona, Spain.

Hajimiri et al., Integrated Phased Array Systems in Silicon, Proceedings of the IEEE, Sep. 2005, pp. 1637-1665, vol. 93, No. 9.

Mohit Anand, Applications of Metamaterial in Antenna Engineering, International Journal of Technical Research and Applications, Jan.-Feb. 2014, pp. 49-52, vol. 2, Issue 1, Bangalore, India.

CST Studio Suite, Inmarsat Phased Array Design using Antenna Magus, System Integrity Workshop Series, 2012, Computer Simulation Technology.

Van Der Vossen et al., Design of a Highly Integrated Ku-band Planar Broadband Phased Array Receiver with Dual Polarizatiion, European Radar Conference (EuRAD), Nov. 2014, Rome, Italy.

Klatser et al., An Ultra Flat Phased Array Antenna With Integrated Receivers in SiGe BiCMOS, International Journal of Microwave and Wireless Technologies, 2015.

Kim et al., Impact Behavior of Composite-Surface-Antenna Having Dual Band, Piers Online, 2011, pp. 281-285, vol. 7, No. 3.

Sayan Roy, Designing of a Small Wearable Conformal Phased Array Antenna for Wireless Communications, Thesis, North Dakota State University, Aug. 2012, pp. 1-64, Fargo, North Dakota.

Kymeta, Aeronautical Terminal Products, Webpages, Mar. 25, 2013, url: www.kymetacorp.com/products/aeronautical-products/.

* cited by examiner

202

ANTENNA ASSEMBLY

CROSS-REFERENCE TO RELATED APPLICATIONS

The present application is a non-provisional of prior U.S. Provisional Patent Application No. 62/334,548 filed May 11, 2016. The content of the foregoing prior application is hereby incorporated herein its entirety for any and all purposes.

STATEMENT RE: FEDERALLY SPONSORED RESEARCH

Not Applicable.

TECHNICAL FIELD

The present disclosure relates to antennas for satellite communication, and more particularly to antenna assemblies including an array of antenna elements configured to operate as a phased array.

BACKGROUND

One conventional approach to antenna assemblies for satellite communication has been to provide paraboloid shapes, i.e., a dish shape, and point it towards a satellite. This is an efficient and cost effective solution for ground based installations, especially for communication with geostationary satellites. It has also been satisfactory for some vehicle applications, such as in the maritime industry where vessels travel at relatively low speeds in which a low profile antenna assembly is not critical for drag reduction. Further, greater weight and power requirements are more easily tolerated for marine surface vessels.

Some attempts have been made to provide paraboloid types of antennas on aircraft. However, the applications have been limited to areas where the antenna can be enclosed behind a radome to reduce drag. This has constrained the size of the antenna assembly, and hence performance. In addition, aircraft move at a much greater rate of speed relative to marine vessels and difficulties are frequently encountered in maintaining proper orientation of the assembly relative to a satellite, i.e., keeping the assembly pointed towards the satellite. While satisfactory for some military and business applications, other solutions have been attempted for aircraft used for commercial passenger transport, such as planar arrays of antennas configured to cooperatively act together in a phased array.

Instead of a large paraboloid structure for concentrating and directing a signal, a planar antenna array employs a group of smaller antenna elements. In particular, the signals from each element of the array are combined to produce a beam having a predefined shape and direction. Beam direction is changed as needed via a control system that adjusts the phase and gain of signals transmitted and received to and from the elements of the array to combine individual signals to shape and direct the beam.

The advantage of planar phased arrays for use on vehicles, especially aircraft, is the low profile of the array. Namely, the arrays can be formed to have a substantially planar surface. However, there are drawbacks, of which a major one is the limited range of angles through which the beam may be directed or steered. In the past, the range has been limited to directions deflecting the beam from about 45 degrees to 60 degrees from perpendicular to the plane of the array. While steering the beam to angles beyond this range is possible, reception and transmission performance tends to degrade rapidly. Attempts have been made to expand the effective deflection range by making the planar array rotatable about one or more axes. While making the array rotatable does expand the range of angles over which nominal reception and transmission performance may be maintained, it requires the addition of mounting structure providing rotatable axes that adds significant weight. Moreover, the mounting structure requires space for the mounting structure itself and permitting rotations of the array, which increases the profile height of the resulting antenna assembly. Further, repeatedly rotating the planar array tends to reduce the mean time between failures (MTBF).

Finally, it requires power to operate the phased array, which results in significant waste heat that must be dissipated. This can be difficult because the radome enclosing the antenna assembly traps heat, and excessive temperatures degrades performance of the array. Moreover, the power required by the phased array results in increased fuel consumption. Accordingly, better solutions are desired.

SUMMARY OF THE DISCLOSURE

In one aspect, an antenna assembly is disclosed. The antenna assembly includes a support and antenna tiles disposed in the support. The antenna tiles form an external surface corresponding substantially in shape to lateral faces of a frustum. The frustum includes a central axis with the antenna tiles disposed around the central axis of the frustum and sloping away therefrom. Each antenna tile includes opposite ends, with one end narrower than the other end.

A planar array of antenna elements is disposed on each antenna tile in which the antenna elements of each array are configured to operate as a phased array. A control system connects to the planar arrays of antenna elements in which the control system is configured to selectively activate and deactivate each of the planar arrays.

In another aspect, an antenna assembly for mounting on a vehicle for supporting communication with a satellite is disclosed. The antenna assembly includes a support and an outer group of antenna tiles disposed in the support in which the antenna tiles form an external surface corresponding substantially in shape to lateral faces of a frustum. The frustum includes an apex with the antenna tiles of the outer group extending around the apex of the frustum, and the outer group of antenna tiles including an inner periphery. An inner group of antenna tiles extends around the inner periphery of the outer group of antenna tiles, with the inner group of antenna tiles disposed between the support and the apex of the frustum. A planar array of antenna elements is disposed on each antenna tile of the inner and outer groups of antenna tiles in which the antenna elements of each array are configured to operate as a phased array. The antenna assembly includes a control system connected to the planar arrays of antenna elements in which the control system is configured to selectively activate and deactivate each planar array.

In still another aspect, disclosed is an antenna assembly for mounting on a vehicle for supporting communication with a satellite. The antenna assembly includes antenna tiles arranged in an annular configuration around a central axis with the antenna tiles sloping away from the central axis towards the vehicle. Each antenna tile in the foregoing annular configuration is substantially identical to one another.

The assembly includes a planar array of antenna elements disposed on each antenna tile in which the antenna elements of each array are configured to operate as a phased array. The assembly also includes a control system connected to the planar arrays of antenna elements in which the control system is configured to selectively activate and deactivate each of the planar arrays.

In yet another aspect, the foregoing antenna assembly, further includes an inner annular arrangement of antenna tiles disposed around the central axis, in which the inner configuration is disposed between the central axis and the other annular configuration.

The antenna elements of each array are configured to operate as a phased array. Each antenna element may be implemented by using bipolar radiators (vertical and horizontal). Each tile can align itself to the line of site vector, comprising azimuth, elevation and polarization values. This may be done in two different ways. One, each element is aligned to the proper polarization, and then the entire tile aligned to the proper azimuth and elevation values. Two, all the radiators, for horizontal and vertical orientation, are first aligned to the proper azimuth and elevation vectors and then polarization alignment is performed. The net effect is the same, as the tile will be properly aligned to azimuth, elevation, and polarization. Each method has its own advantages and drawbacks.

The control system connected to the planar arrays of antenna elements is configured to activate each of the antenna tiles by supplying signals to the planar array of antenna elements disposed on the tile, in which the control system dynamically activates a subset of the tiles to support communication as the vehicle moves. The control system also aligns the phase of selected tiles and antenna elements to generate a variable beam. At the same time, the control system aligns the phase and amplitude between the vertical and horizontal selected antenna elements to generate a variable linear or circular polarization.

Other aspects and advantages will become apparent from the following description, taken in conjunction with the accompanying drawings.

BRIEF DESCRIPTION OF THE DRAWINGS

The various features of the present disclosure will now be described with reference to the drawings of the various aspects disclosed herein. In the drawings, the same components may have the same reference numerals. Note that the drawings are not intended to be to scale or show actual quantities of components or relative sizes. The illustrated aspects are intended to illustrate, but not to limit the present disclosure. The drawings include the following Figures.

DETAILED DESCRIPTION

As a preliminary note, the terms “component”, “module”, “system,” and the like as used herein are intended to refer to a computer-related and/or information processing entity, either software-executing general or special purpose processor, hardware, firmware and/or a combination thereof. For example, a component may be, but is not limited to being, a process running on a hardware processor, a hardware processor, an object, an executable, a thread of execution, a program, and/or a computer. For example, a controller or control system may be implemented in software, hardware, and/or a combination thereof, and may include a group of two or more control systems working cooperatively.

By way of illustration, both an application running on a server and the server can be a component. One or more components may reside within a process and/or thread of execution, and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal).

Computer executable components can be stored, for example, at non-transitory, computer readable media including, but not limited to, an ASIC (application specific integrated circuit), CD (compact disc), DVD (digital video disk), ROM (read only memory), floppy disk, hard disk, EEPROM (electrically erasable programmable read only memory), solid state memory device or any other storage device, in accordance with the claimed subject matter.

Figure 1:
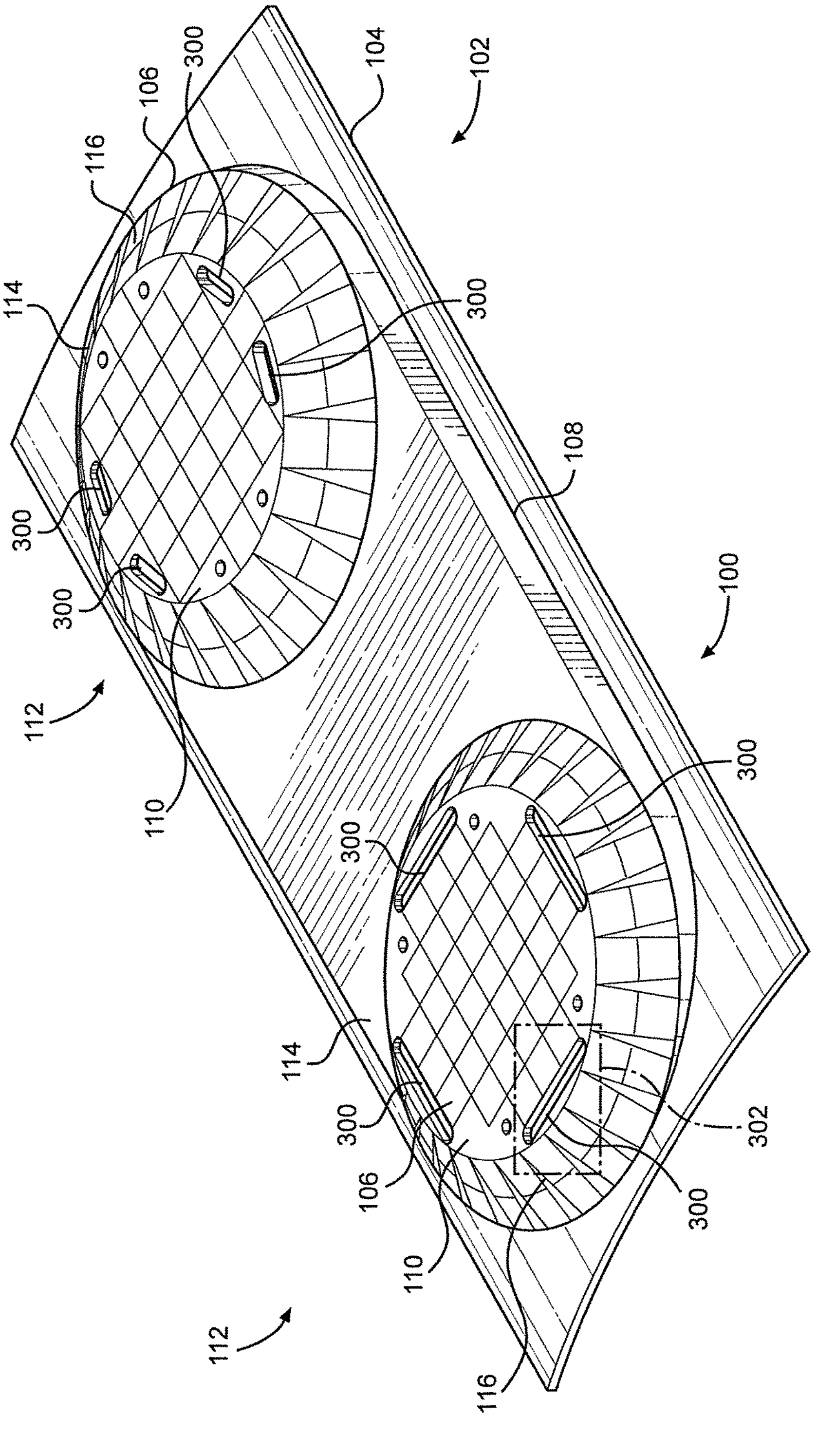
FIG. 1 is a schematic illustration of two antenna assemblies.

In one aspect, the following disclosure describes an antenna assembly intended for use on vehicles. FIG. 1 shows an example of a pair of spaced apart antenna assemblies indicated generally by reference numerals 100 and 102, respectively. Each antenna assembly 100 and 102 is configured for installation on an aircraft fuselage 104 (only a portion of the aircraft fuselage 104 is illustrated in FIG. 1), specifically on the top of the fuselage.

One antenna assembly 100 is for transmission of signals to a satellite, while the other antenna assembly 102 is for receiving signals from a satellite. A single antenna assembly may be provided that performs both reception and transmission for applications where space is limited. However where space is available, separate antenna assemblies 100 and 102 provide an advantage in that signal losses are reduced relative to a single antenna configuration. In addition, the distance or gap between the antenna assemblies 100 and 102 reduces cross-talk between reception and transmission signals and further reduces losses. As an alternative, two antennas may be provided as shown, in which each antenna may be used for both transmission and reception concurrently, with the output from each antenna in reception combined in digital form to enhance received signal SNR (signal to noise ratio). Notwithstanding, separate antenna assemblies 100 and 102, with one for reception and the other for transmission, have an advantage with respect to reduced complexity.

Each antenna assembly 100 and 102 includes a plurality of antenna tiles 106. For reduced manufacturing and replacement cost, the antenna tiles 106 are preferably substantially identical to one another in shape. Each tile 102 corresponds substantially in shape to a polygon, preferably to a parallelogram, more preferably to a rectangle, and even more preferably to a square or hexagon. Other shapes may be used as well, such as circles, triangles, rectangles, etc. In general, shapes are preferred that can be placed together without overlapping or leaving gaps between tiles, i.e., shapes in which tessellation is possible.

The antenna tiles 106 of its respective antenna assembly 100 or 102, are preferably substantially the same size for further reduced manufacturing and replacement costs, i.e., each tile 106 has substantially the same dimensions. For an antenna assembly 100 or 102 intended for a wide-body aircraft, and using square tiles 106, a tile range from 50 mm×50 mm to 200 mm×200 m are suitable, and preferably falling between that range, and more preferably around 100 mm×100 mm, and more preferably about 90% of the value for tiles 106 used for reception and 80% for tiles used for transmission. The thickness of each tile 106 is preferably not more than 30 mm in thickness, and more preferably between 15 mm to 20 mm in thickness. Thinner tiles 106 are preferred for lighter weight and lower profiles of the antenna assemblies 100 and 102 for reduced drag.

The antenna assemblies 100 and 102 includes a plate or skirt 108 on which the tiles 106 are disposed and supported above the aircraft fuselage 104. More particularly, each antenna assembly 100 and 102 is mounted on the skirt 108, and the tiles 106 of its respective antenna assembly disposed in a support 110 of each antenna assembly. When the tiles 106 of each antenna assembly are mounted in the support 110 thereof, each antenna assembly 100 and 102 forms an external surface conforming substantially in shape to a frustum, indicated generally by reference numeral 112. In particular, the shape corresponds substantially to a frustum of a right circular cone. Other frustums are possible as well, for example in applications where high aerodynamic efficiency is essential, the shape may a frustum of a non-right or non-circular cone to provide a swept or oval geometry when viewed from above.

Figure 2:
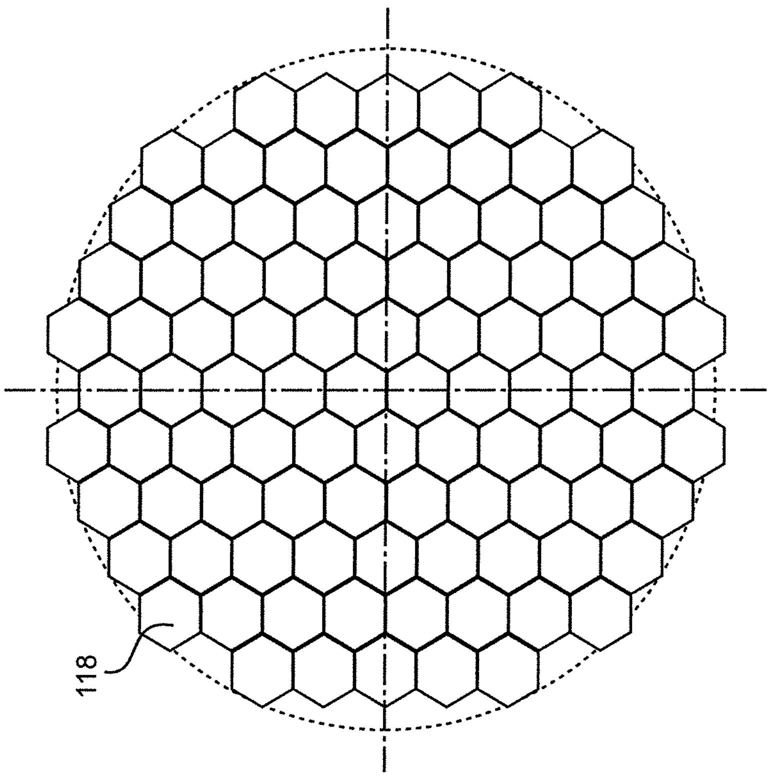
FIG. 2 is a schematic illustration showing an alternative shape for tiles forming the antenna assemblies of FIG. 1.

The tiles 106 of each assembly 100 and 102 include a group of tiles forming together with the support 110, a planar top of each frustum 112. The planar top is substantially circular and includes an outer boundary 114. As the outer boundary 114 is substantially circular or ring shaped, the polygonal tiles 106 do not evenly meet the boundary 114 and some gaps are left. For applications where higher gain is desired, additional tiles 106 may be added and/or specially shaped for more complete coverage on the planar top of each frustum 112. In another configuration as shown in FIG. 2, tiles 118 in the shape of hexagons can be used for improved conformity with a circular shape. Tiles 118 would be sized to have the same area as tiles 106.

Another group of tiles 106 together with the support 110 form a substantially curved side surface 116 of each frustum 112. In this regard, the tiles 106 with the support 110 form the curved side surface 116 within the resolution of the dimensions of the tiles 106 on the support 110. In this regard, see FIG. 3, in which it can be seen that the antenna assemblies 100 and 102 substantially approximate a circular outer boundary via short, straight segments 113 and 114.

The substantially curved side surface 116 extends around the outer boundary of the planar top of each frustum 112, and slopes downwardly away therefrom to the skirt 108 supporting the antenna assemblies 100 and 102 on the vehicle fuselage 104. The tiles 106 do not completely cover the side surface 116 and wedge shaped gaps are left between rows of tiles 106. In other applications, where higher gain is desired, the tiles 106 for the sides 116 may be specially shaped for better coverage, e.g., wedge or trapezoidal shaped tiles.

Figure 3:
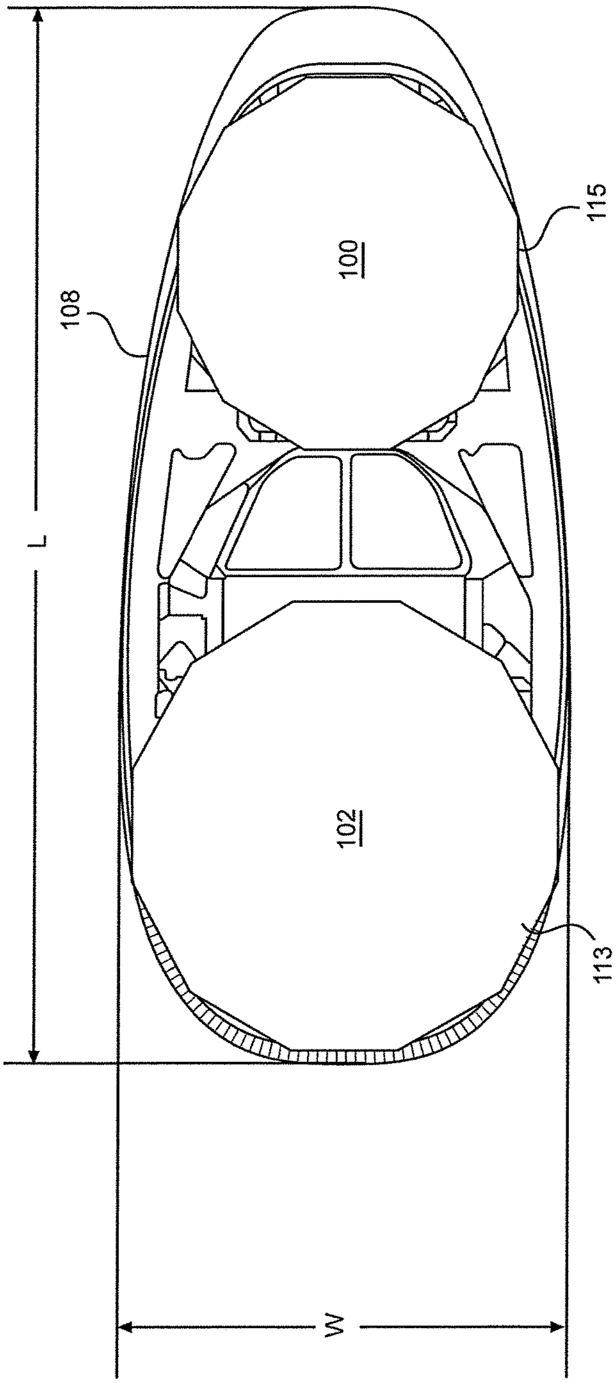
FIGS. 3 and 4 are schematic illustrations of the size and shape requirements for the ARINC 791 standard.
Figure 4:
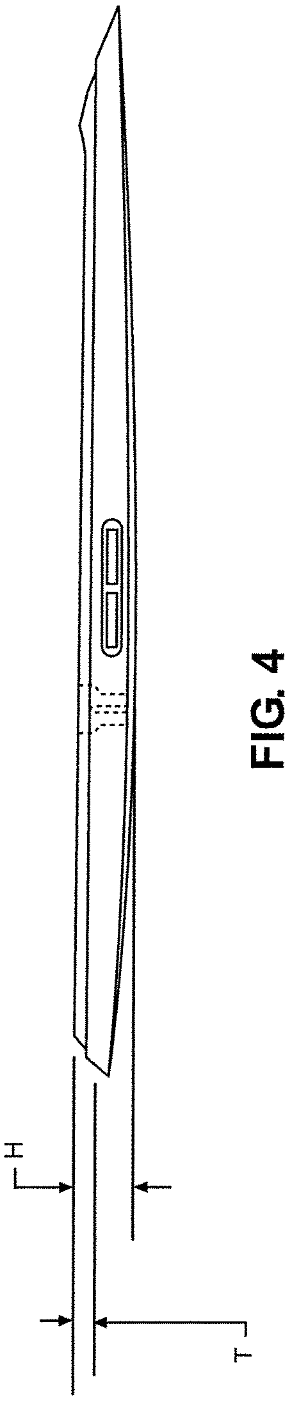

The antenna assemblies 100 and 102 are sized and shaped to fit within the space specified by the ARINC 791 standard, at least for wide-body aircraft. An example of the antenna assemblies 100 and 102 installed with the size and space specified by the ARINC 791 standard is schematically illustrated in FIGS. 3 and 4. The ARINC 791 standard provides for a length L of 2370.6 mm and a maximum width W of 1121.2 mm. The ARINC 791 standard further provides for a height H of 140.0 mm and a thickness T of 54.0 mm. Due to curvature, the width W is narrower in the forward direction of the vehicle. Therefore, the forward antenna assembly 100 is smaller than the after antenna assembly 102 by being formed from less tiles 106 and/or being formed of tiles of smaller dimensions.

Figure 5:
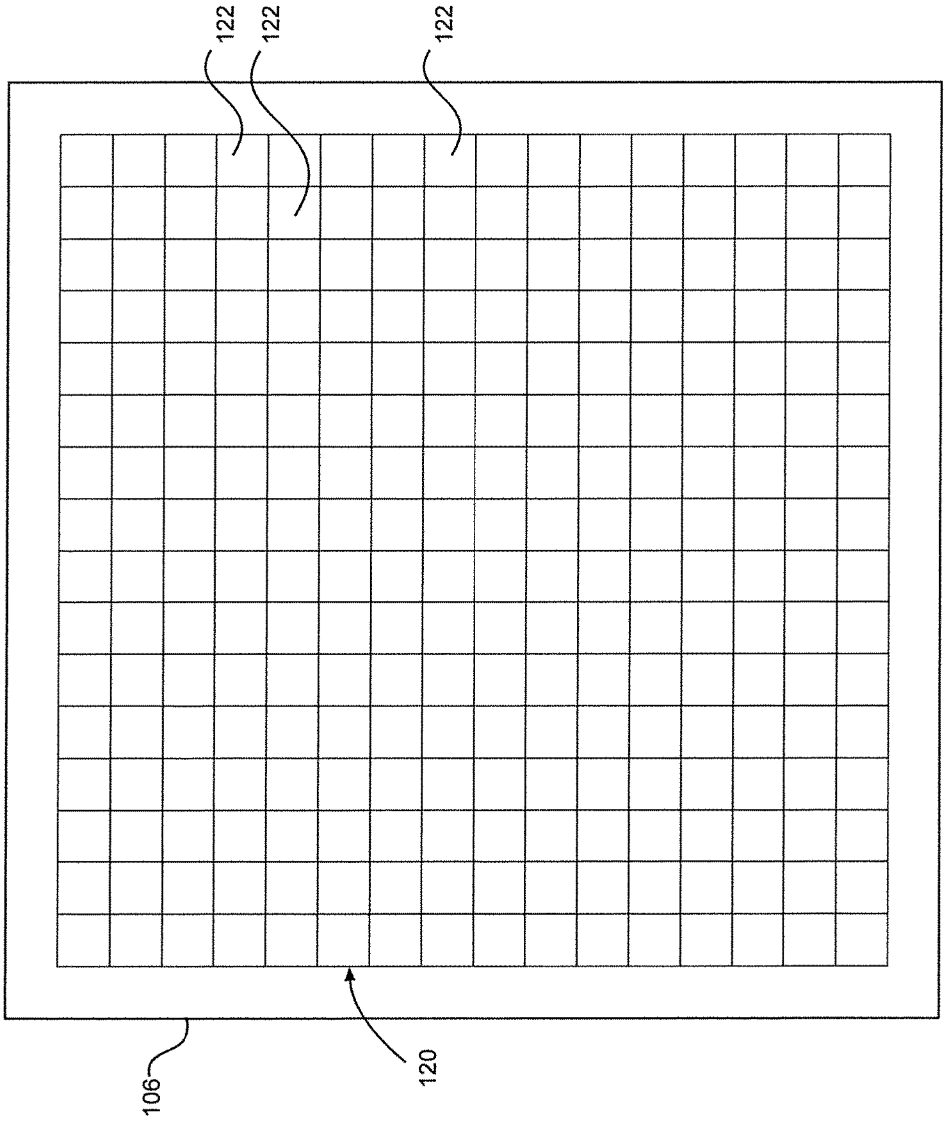
FIG. 5 is a schematic illustration of a tile from FIG. 1 to show a planar array of antenna elements disposed on the tile.

As schematically illustrated in FIG. 5, a planar array 120 of antenna elements 122 is disposed on each antenna tile. Each antenna element 122 is a radiating element cell, i.e., the smallest building block or component of an antenna array and is wideband. Each antenna element may be implemented by using bipolar radiators (vertical and horizontal). The antenna elements 122 may have polygonal or circular apertures, but are preferably square and stacked patch antennas for greater bandwidth. The antenna elements 122 may be dual edge-fed, pin-fed, EM-coupled or other patch type configured to operate as a phased array as is known in the art. Preferably, the quantity of antenna elements in each array 120 is a square number or perfect square, i.e., an integer that is a square of an integer for multiple axes of symmetry when centered upon a tile 106. As illustrated, the planar array 120 includes a totally of sixty-four antenna elements 122, i.e., an eight-by-eight array. More or less elements 122 may be provided depending upon the intended application. Each antenna tile 106 is formed of a printed circuit board material, upon which the antenna elements 122 forming the array 120 are mounted.

Figure 6:
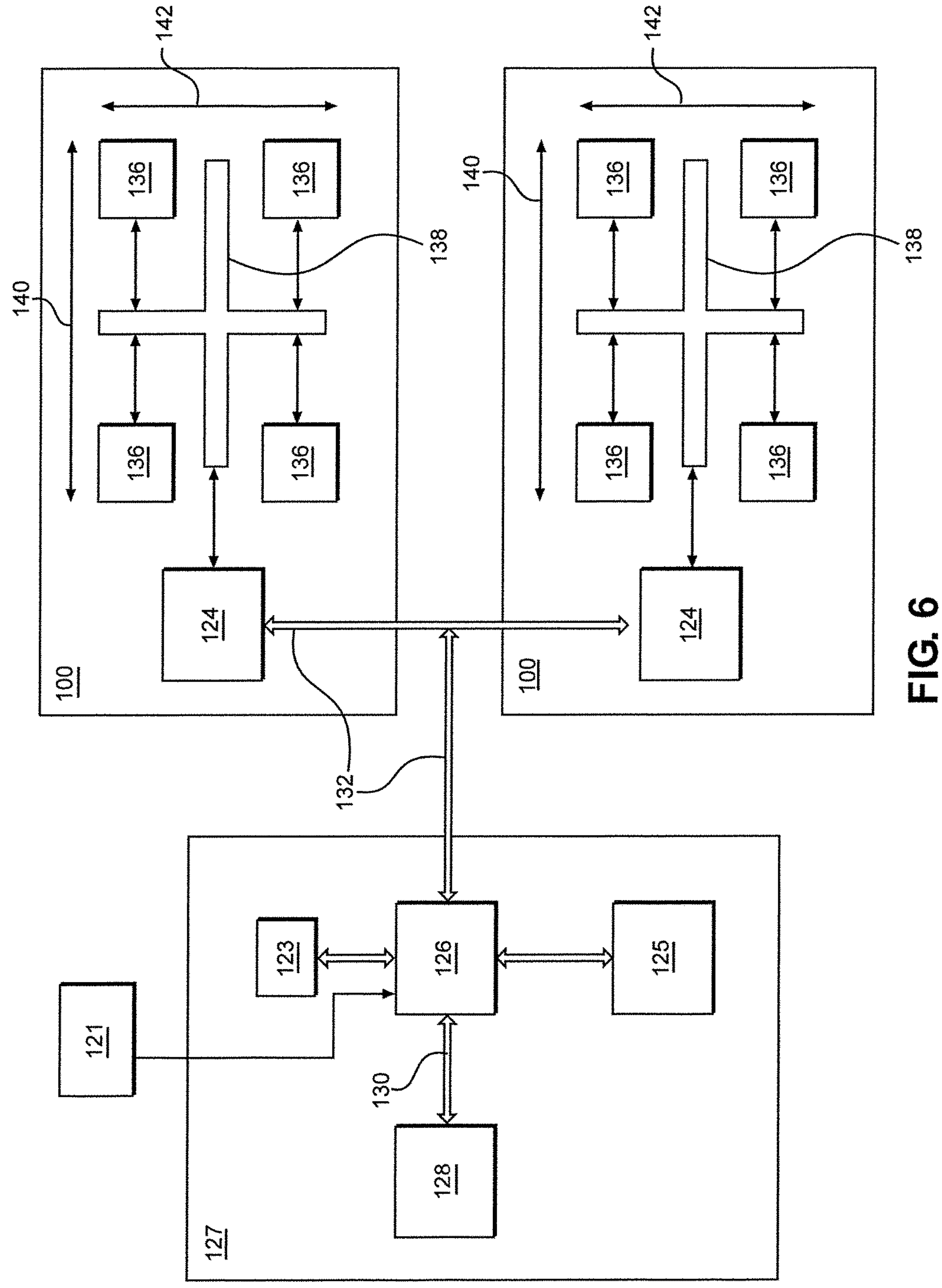
FIG. 6 is a schematic block diagram illustrating a control system connected to the planar array of antenna elements on a tile.

Each antenna assembly 100 and 102 includes an antenna controller or control system 124 (see FIG. 6) connected to the planar array 120 of antenna elements 122 on each tile 106. In particular, the control system 124 of each antenna assembly 100 and 102 is configured to selectively activate and deactivate each of its tiles 106 by activating and deactivating the planar array 120 of each tile 106. The control system 124 of each antenna assembly 100 and 102 is controlled by a master or main controller 126.

The main controller 126 is provided as part of baseplate equipment 127, which includes a DC power distribution network based on an AC/DC power supply from the vehicle (typically 48 VDC for aircraft) 121, an on-board modem 125, and an antenna positioning system 123, which can provide full data (GPS location and vehicle positioning) for satellite tracking. The main controller 126 is responsible for overall control of each antenna assembly 100 and 102, line of sight calculations, built-in testing and test equipment (BIT/BITE) management, and communication with external controllers 128, such as a broadband controller including a modem, in the vehicle and specific antenna controllers. The broadband controller provides the transmission antenna assembly 100 with L-band signals for transmission. Conversely, the receiving antenna assembly 102 provides the broadband controller with received signals in the L-band.

The main controller 126 is also in communication with an ARINC 429 bus from the vehicle via the broadband controller for using vehicle navigation data to compute antenna pointing values. The master controller 126 communicates with the external controllers 128 via Ethernet lines 130 (100Base-T or faster) using simple network management protocol (SNMP) and/or proprietary protocol(s) to other types of controllers, such as maintenance controllers.

The on-board modem 125 is preferably based on the DVB-S2 standard (or later version) and provides each antenna control system 124 with information about pointing accuracy, such as received SNR and signal strength. The on-board modem 125 may also be used as a main or master modem replacing the modem of the broadband controller. In this case, physical layer processing is performed on the on-board modem 125 while data framing is performed on the broadband controller. In either situation, the modem 125 can provide the control system 124 for the transmitting antenna assembly 100, information about TDMA timing, so that the antenna control system 100 can switch transmission on and off and reducing total average power consumption.

The control system 124 of each antenna assembly 100 and 102 receives the computed line-of-sight values, i.e., elevation, azimuth, and polarity, and other information from the main controller 126 over a high speed bus lines 132. The information is computed and provided by the main controller 126 at last frequently as every 20 milliseconds, more preferably at least every 10 milliseconds, and even more preferably at least every 5 milliseconds.

Each antenna controller 124 uses this information to determine the tile 106 configuration for achieving the line-of-sight values and communicates the configuration to a tile controller 136 on each tile 106 over a high speed tile bus 138. For convenient illustration, only four tile controllers 136 are illustrated in each antenna assembly 100 and 102. The remaining tile controllers 136 are presented by the solid black double headed arrows 140 and 142, indicating rows and columns of tiles 106 with each having a tile controller. The high speed tile base is implemented as a high speed USB or Ethernet connection.

The control system 124 for each antenna identifies a tile 106 by its location or position in the antenna assembly 100 or 102, and provides an initial phase. Each tile controller 136 controls the array 120 of its tile 106 based on instructions from its respective antenna control system 124. Steering or pointing is performed by two processes running in parallel: (i) coarse pointing performed by the antenna control system 124 based on tile mapping and phase distribution; and (ii) fine pointing performed by each tile controller 136 based the phase and amplitude distribution of the antenna elements of its corresponding array 120. Each tile controller 136 performs phase and amplitude adjustments for its array 120 as required by the azimuth, elevation, and polarity values communicated to it from its respective antenna control system 124. Each tile controller 136 may be implemented as a control software or as a separate component.

It is envisioned that the parallel processing will dramatically reduce the antenna pointing mechanism time constants, as coarse tuning or steering will provide relatively accurate pointing on all three axes and can be performed relatively fast, due to being at the tile level. Following the coarse tuning, each tile 106 is aligning itself in parallel to all other tiles. The net effect is reduction in antenna pointing time constant by a factor which is more or less equal to the number of antenna elements 122 per tile 106.

Figure 8:
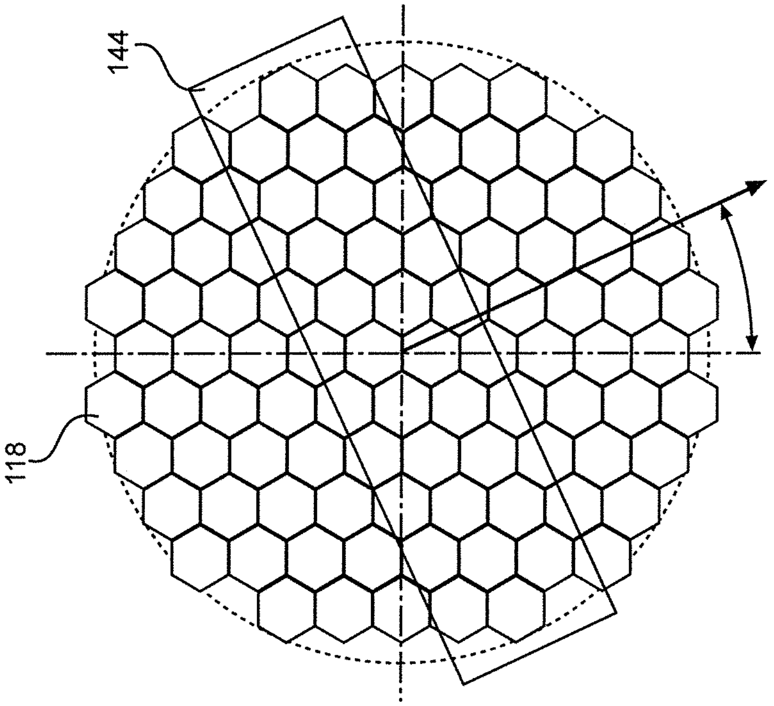
FIGS. 7 and 8 is are schematic illustrations of examples of adaptive tile mapping.
Figure 7:
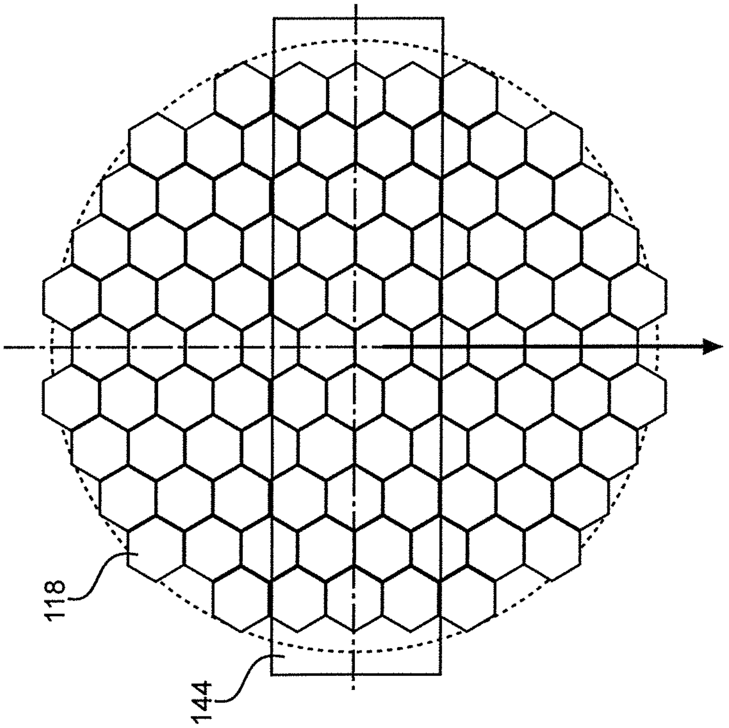

To avoid unnecessary power consumption and to eliminate wide scanning range in azimuth, the control system 124 for each antenna assembly 100 and 102 determines which tiles should be active, i.e., and which tiles should be operated with minimal power consumption, i.e., deactivated or in standby mode). This procedure shall be exercised for the group of tiles on the planar top of each frustum 112, and the group of tiles forming the substantially curved side surface 116 of each frustum 112. Examples of adaptive tile mapping are shown in FIGS. 7 and 8 for coarse azimuth steering showing the case of zero degrees azimuth in FIG. 7 and −25 degrees azimuth in FIG. 8 with hexagon shaped tiles 118 on the planar portion of a frustum. In FIGS. 7 and 8, tiles 118 under the shaded rectangular portion 144 are activated, whiles other tiles are on standby and deactivated. Shapes other than rectangular may be used for determining which tiles 106 or 118 should be activated or deactivated, depending on the application, such as a parallelogram, trapezoidal, triangular, circular, oval, and other polygonal and geometric shapes, including irregular polygons and shapes. A similar process is also provided for tiles on the substantially curved side of a frustum 116. Partially covered tiles may be partially activated as explained in the following paragraphs with reference to FIG. 9.

Figure 9:
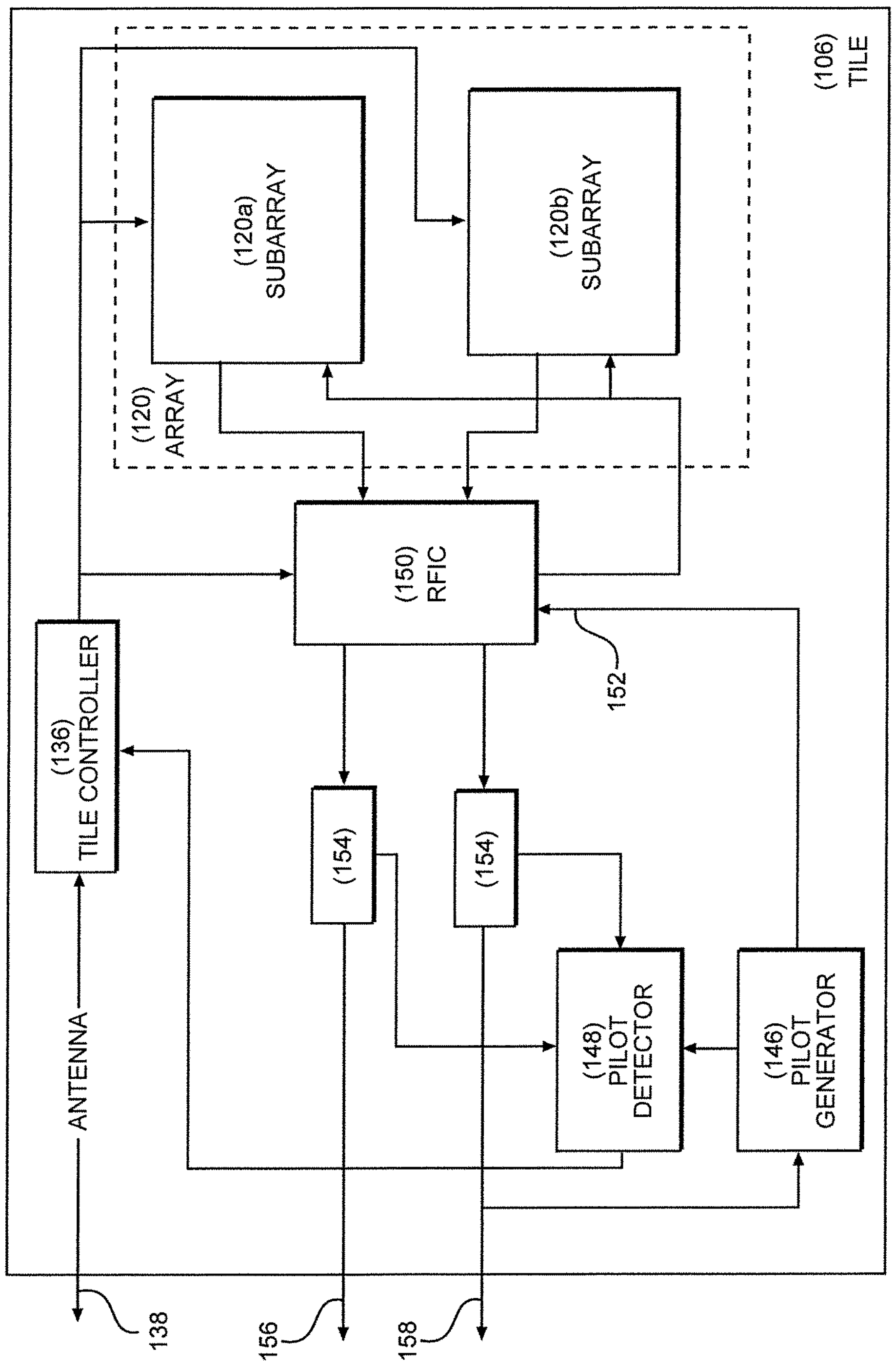
FIG. 9 is a schematic bock diagram illustrating a tile having a planar array functionally divided into subsets or subarrays of antenna elements forming the planar array.

FIG. 9 schematically illustrates a tile 106 for receiving a signal. The planar array 120 (illustrated by a dotted line) of the tile 106 has been functionally divided into a subset or subarray **120*a* of one-half of the antenna elements 122 and another subset or subarray 120*b* of the remaining antenna elements 122 of the array 120. The two subarrays 120*a* and 120*b* may be organized as alternating antenna elements 122 within the array 120, or as antenna elements 122 on one-half of the array 120 belonging to one subarray 120*a* or 120*b* and the antenna elements 122 on the other half of the array 120 belong to the other subarray 120*a* or 120**. Communication between the tile controller and the tile's antenna elements is implemented using the same principles as described previously for communication between the antenna controller and the tile controllers. That is, the same principles are used both the macro level (antenna) and the micro level (tile).

Each receiving tile 106 includes a pilot generator 146, pilot detector 148, and at least one radio frequency integrated circuit (RFIC) 150 for each antenna element 122 of the array 120 (for convenient illustration, the RFICs are shown as a single component in FIG. 9). In an alternate embodiment, an RFIC 150 may be provided every two antenna elements 122. The tile controller 136 uses the pilot generator 146 and pilot detector 148 to align the internal relative phase and amplitudes between the antenna elements 122 on the tile 122, relative to a given reference antenna element 122 as is known in the art. The pilot generator 146 is used to align the center phase and amplitude of the tile 106 itself by injecting or supplying a pilot signal 152 to the RFIC 150 of the tile 106 for each array and aligning the tile's phase and amplitude relative to other tiles in the antenna assembly 102. In this case, the pilot signal 152 phase and amplitude is measured by a pilot detector 148, which can be selectively provided to the pilot detector by a switch or coupler 154. After alignment has been performed, the coupler 154 bypasses the pilot detector 148 and outputs a reception beam 156 and 158. One beam 156 is from one subarray 120*a* and 120*b* and the other is from the other subarray 120*a* or 120*b*. Calibration data will be stored in non-volatile memory of each tile controller 136 for calibration of the tile 106, and in non-volatile memory of each antenna controller 124 overall calibration of the tiles.

Operation is permitted as a single beam or two beams as described above for each receiving tile 106. Alternatively, a tile 106 could be partially activated or deactivated by using only one of the subarrays 120*a* and 120*b*. Use of two beams permits the receiving antenna assembly 102 to be used to receive a signal from two different satellites concurrently. That is, one beam may be use to receive a signal from one satellites, while the other beam is used to receive a signal from another satellite. This enable seamless handover between satellites in which the control system 124 dynamically activates a subset or subarray 120*a* and 120*b* as the vehicle moves from coverage by one satellite to another to simultaneously receive signals from both satellites until the transition is complete. Note however, that the foregoing arrangement for dual beam output by a single tile 106 is limited to where the beams are separated in azimuth by 100 degrees or less. For higher degrees of separation dual beam generation is managed by the control system 124 from different tiles 106, rather than subarrays 120*a* and 120*b* on each tile. Alternatively, both beams of the receiving antenna assembly 102 could be used to receive signals from the same satellite for increased bandwidth. In addition, the tiles 106 and subarrays 120*a* and 120*b* may have different polarizations from one another. By way of illustrative, non-limiting example, subarray 120*a* may be controlled to have horizontal polarization, subarray 120*b* controlled to have vertical polarization, while subarrays 120*a* and 120*b* of another tile 106 have circular polarization.

Using the azimuth and elevation values, the control systems 124 for each antenna assembly 100 and 102 determine the tile mapping (which tile should be turned ON and will be active) and the tile's phase and amplitude values (referenced to a given, known antenna element 122). Using a broadcast message, each control system 124 delivers a tile broadcast message. The broadcast message is configured for each receiving beam to specifying each of azimuth, elevation, frequency, and polarity. The message further specifies the tile address, and whether the tile is active or inactive, and also its subarrays 120*a* and 120*b*.

For communication with geostationary satellites in the Ku and/or Ka band and providing a satisfactory communication experience for passengers on wide-body aircraft and smaller, a G/T of at least 9 db/K is provided. Preferably, the G/T is at least 10 db/K, even for circular polarizations at lower elevations scans, e.g., from 10 up to 30 degrees, and more preferably at least 10.5 db/K. For higher elevations scans, e.g., from at least 30 degrees to 90 degrees, G/T is preferably at least 11 db/K, more preferably at least 11.5 db/K, and even more preferably at least 12.5 db/K.

The size of the antenna assemblies 100 and 102 is limited by the size available for mounting. As described earlier, the assemblies 100 and 102 are sized and shaped to fit with the size specified by the ARINC 791 standard, which provides for a maximum width of 1121.2 mm (see FIG. 3). With tiles 106 and 118 sized as described previously, it is conservatively estimated that no more than 150 tiles in quantity would be required for each antenna assembly 100 and 102. Of this, no more than 30 tiles would active simultaneously to achieve the previously described G/T, i.e., not more than twenty percent (20%) of the tiles would be active at the same time.

For higher elevations, e.g., from at least 30 degrees to 90 degrees, substantially only tiles 106 and 118 on the planar top of a frustum 112 would be active. For lower elevations, e.g., less than 30 degrees, substantially only tiles 106 and 118 on side surface 116 would be active. For medium elevations, a combination of tiles 106 and 118 on the top and sides would be active.

Figure 10:
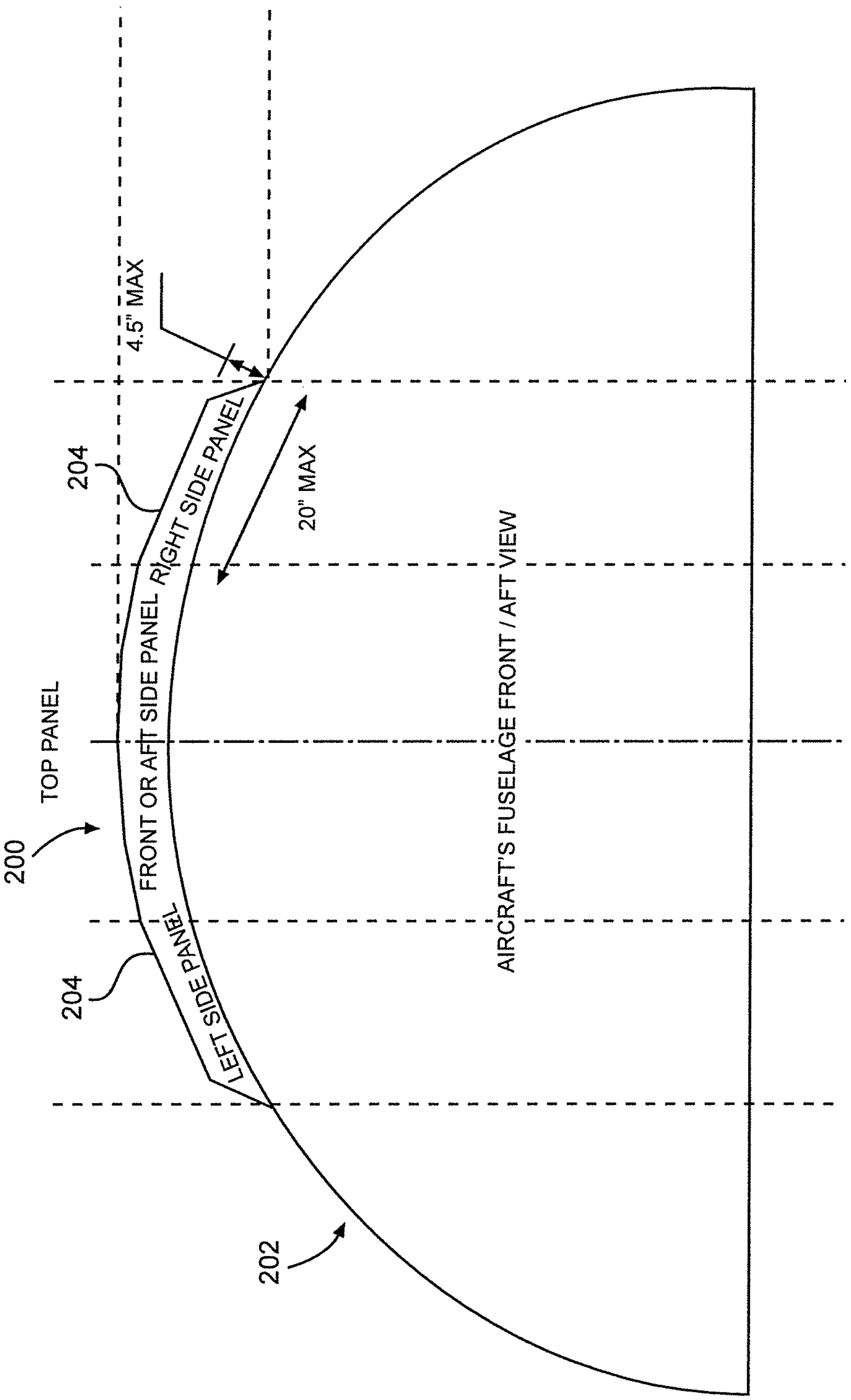
FIGS. 10 through 12 illustrate an alternate configuration adapted for narrow body aircraft.
Figure 11:
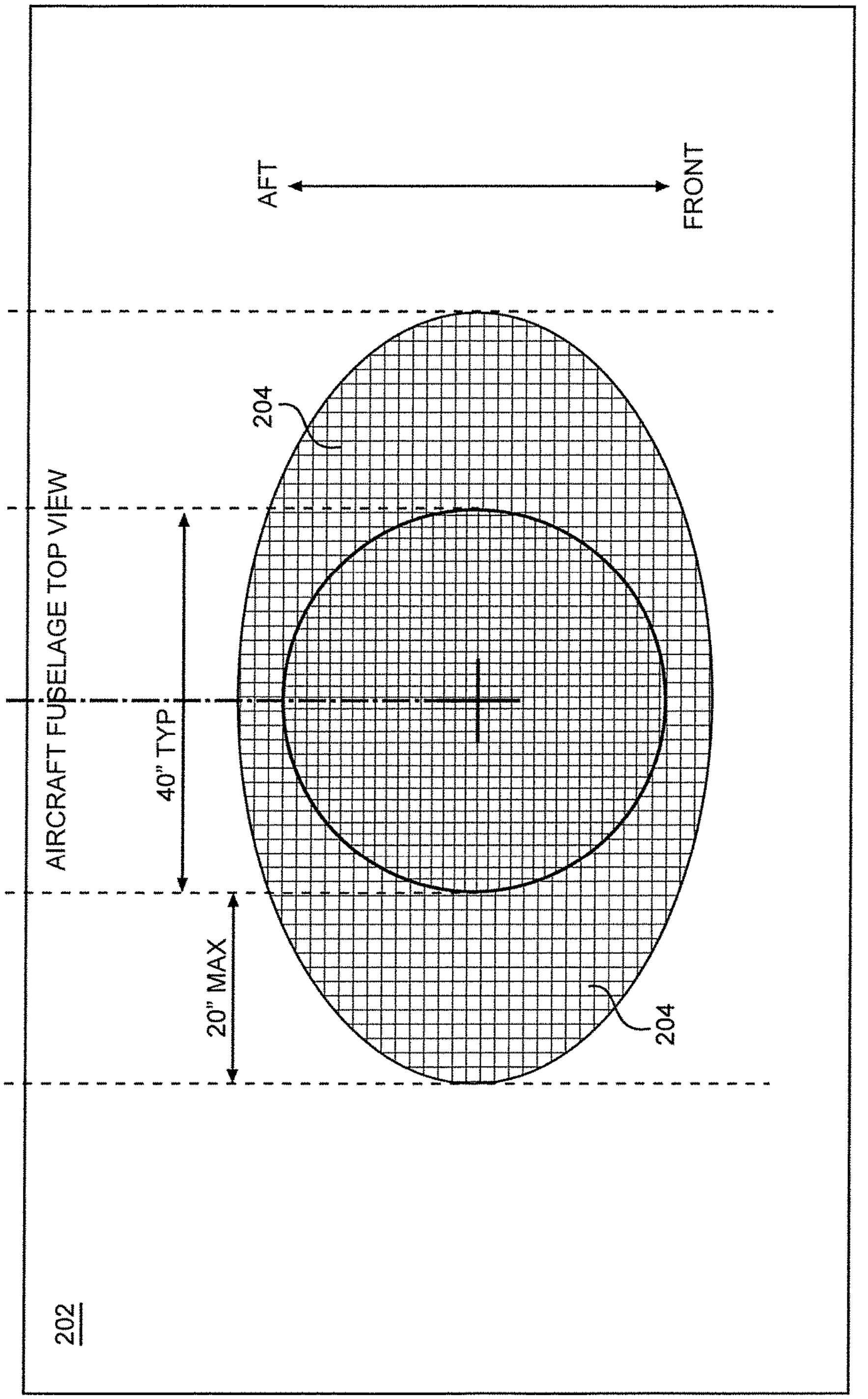

As described above, the antenna assemblies 100 and 102 have been sized to fit within the space constraints as specified by ARINC 729, which is suitable for at least wide-body aircraft. FIG. 10 shows an antenna assembly indicated generally by reference numeral 200, configured for smaller aircraft, such as a narrow body aircraft. In particular, reference to FIG. 10 schematically illustrates a cross-sectional view of the upper portion of an aircraft fuselage 202. As the aircraft fuselage 202 is narrower than that of a wide-body aircraft, there is not as much area available for tiles 106 or 118 on the central top portion of the fuselage. This tends to be problematic for providing adequate communication performance for lower elevations. The antenna assembly 200 compensates by providing extensions 204 or side panels extending from the side surface of the previously described antenna assemblies 100 and 102. Moreover, the extensions 204 substantially conform to the curvature of the aircraft fuselage 202, within the resolution of the tiles 106 or 118 forming the extensions. This achieves a low profile antenna with reduced drag in that it projects no more than a few inches above the fuselage, in particular no more than 120 mm, and typically no more than 115 mm for most installations, or lower. More particularly, the tiles 106 or 118 form a conformal array that substantially follows the vehicle curvature with minimal height above the vehicle surface. A top view of the antenna assembly 200 is shown in FIG. 11.

Figure 12:
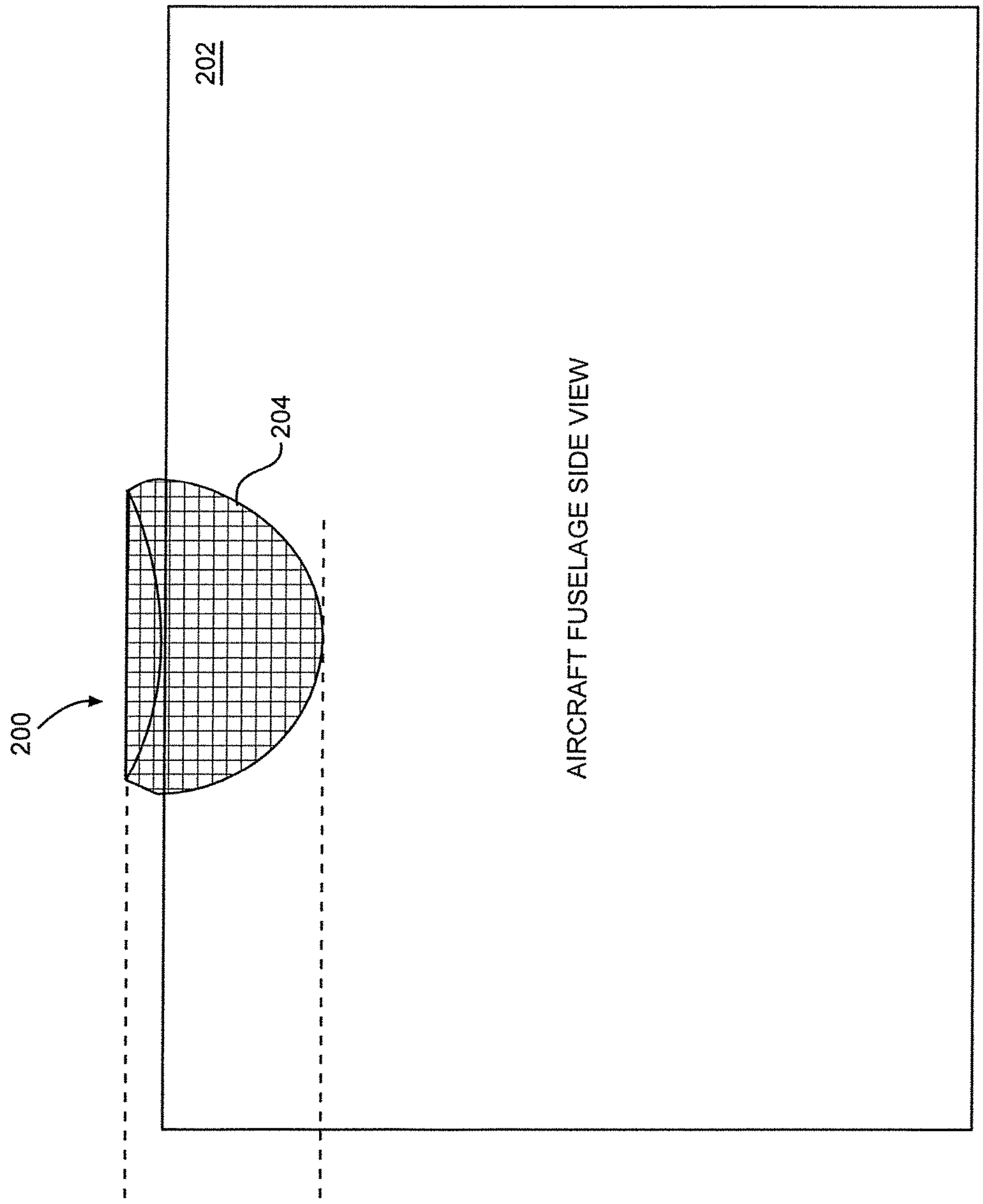

The effective reception or transmission area for the antenna assembly 200 is thereby larger when azimuth is directed to the left or right side (azimuth=±90°±60°) of the aircraft. This can be more clearly seen in FIG. 12, which shows a side view of arrangement. As can be seen, the effective available area for reception and transmission is significantly greater from the side due to the extensions 204. As most flights are east-west oriented, the foregoing situation is quite common and the antenna assembly 200 of FIG. 10 can therefore significantly increase the average G/T when used on narrow body aircraft.

With each of the antenna assemblies 100, 102, and 200, the quantity of tiles 106 or 118 forming the substantially curved side surface 116 is greater than the quantity of tiles forming the planar top of a frustum 112 (see FIG. 1). This provides improved communication performance for low elevations as typically only a portion of the tiles on the substantially curved side surface 116 would be on the side of the aircraft facing a geostationary satellite on a generally east-west flight path. There are at least 25% more side tiles 106 or 118 provided on each assembly 100, 102, and 200, relative to the top of a frustum 112, and preferably at least 33% more. Further, the percentage is preferably at least 40% more if an assembly is used for transmission. In this regard, a larger assembly 102 is used for reception in FIG. 1, as reception is intended to support multiple beams and thus there are greater demands. The substantially curved side surface 116 is advantageous for scanning at low elevation angles, and provides improved performance compared to an antenna arrangement that provides only a substantially flat, top surface.

Returning to FIG. 1, each antenna assembly 100 and 102 includes a plurality of heat sinks 300 opening on the planar top surface of each frustum 112. The heat sinks 300 are spaced around the outer boundary 114 and inward thereof. The heat sinks 300 connect in thermal communication to the tiles 106 for dissipating heat therefrom. In particular, heat from the tiles 106 is dissipated by air passing over the openings of the heat sinks 300. The area enclosed by the rectangle 302 in dashed lines on FIG. 1, is shown enlarged in FIG. 13.

Figure 14:
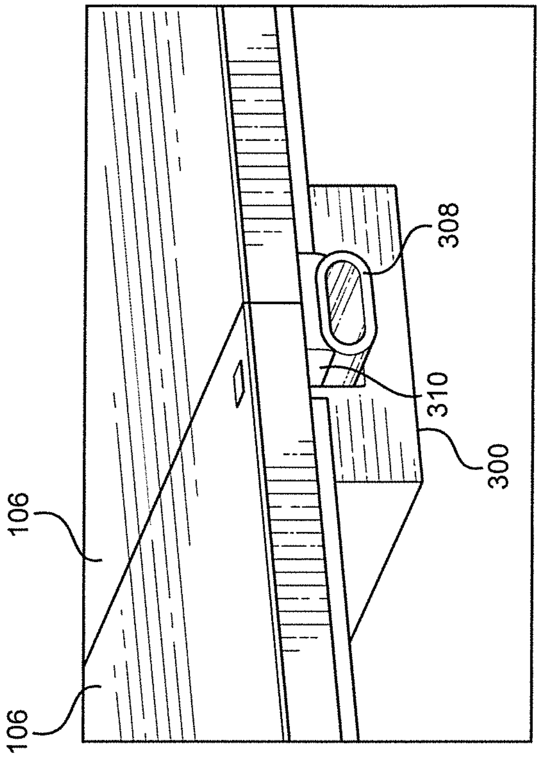
FIG. 14 illustrates a piping system underneath tiles for thermal conduction of heat to a heat sink.
Figure 13:
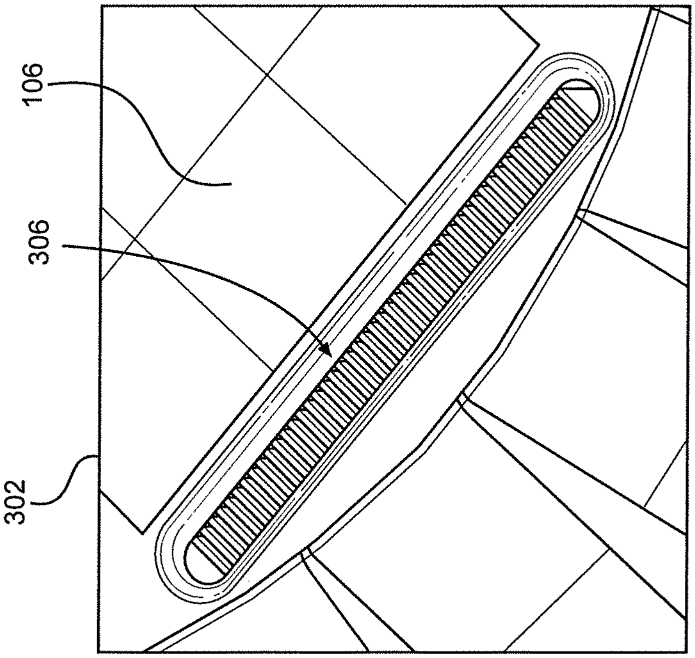
FIG. 13 is a partial view of FIG. 1, illustrating an enlarged view of a heat sink.

As can be seen in FIG. 13, the heat sinks include fins, indicated generally by reference numeral 306, for efficient conduction of heat therefrom to the external environment. FIG. 14 illustrates a portion underneath the tiles 106, showing a pipe 308 in thermal communication with a heat sink 300 the tiles 106. The pipe 308 conducts heat generated by the tiles 106 to heat sink 300. For vibration absorption, a pliable, heat conductive material 310, such as thermally conductive elastomer, may be disposed between the pipe 308 and tiles 106. The tiles 106 or 118 are designed to withstand exposure to the environment and air may pass be passed over the heat sinks 300.

With respect power usage, the antenna assemblies 100 and 102 will require at maximum no more than 500 watts, and preferably no more than 450 watts. Average power consumption will be less than 400 watts, and preferably less than 300 watts. Most of the power will be required for transmission, nominally around 60 to 65% of the power consumed.

Figure 15:
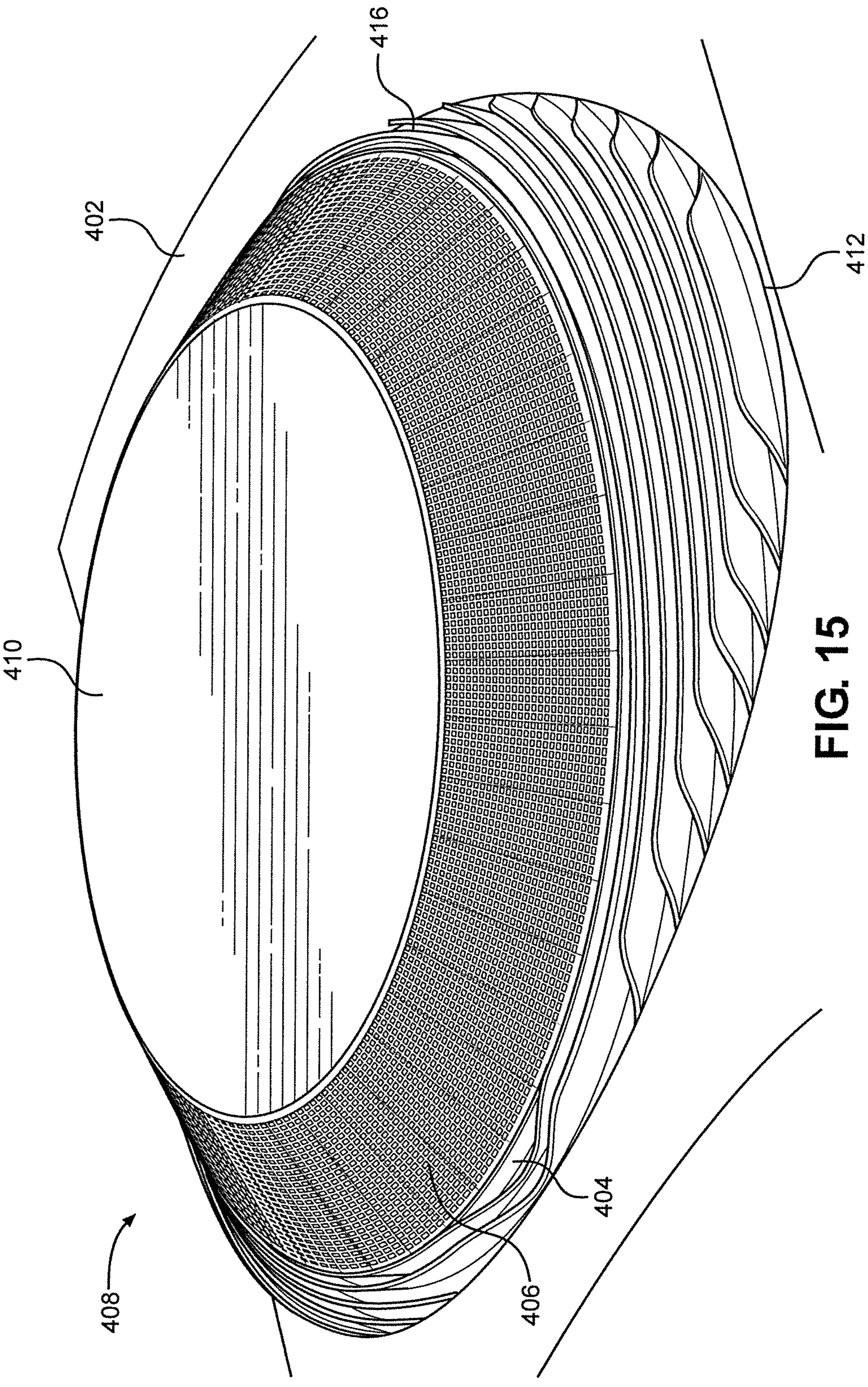
FIG. 15 is a schematic illustration of another antenna assembly.
Figure 18:
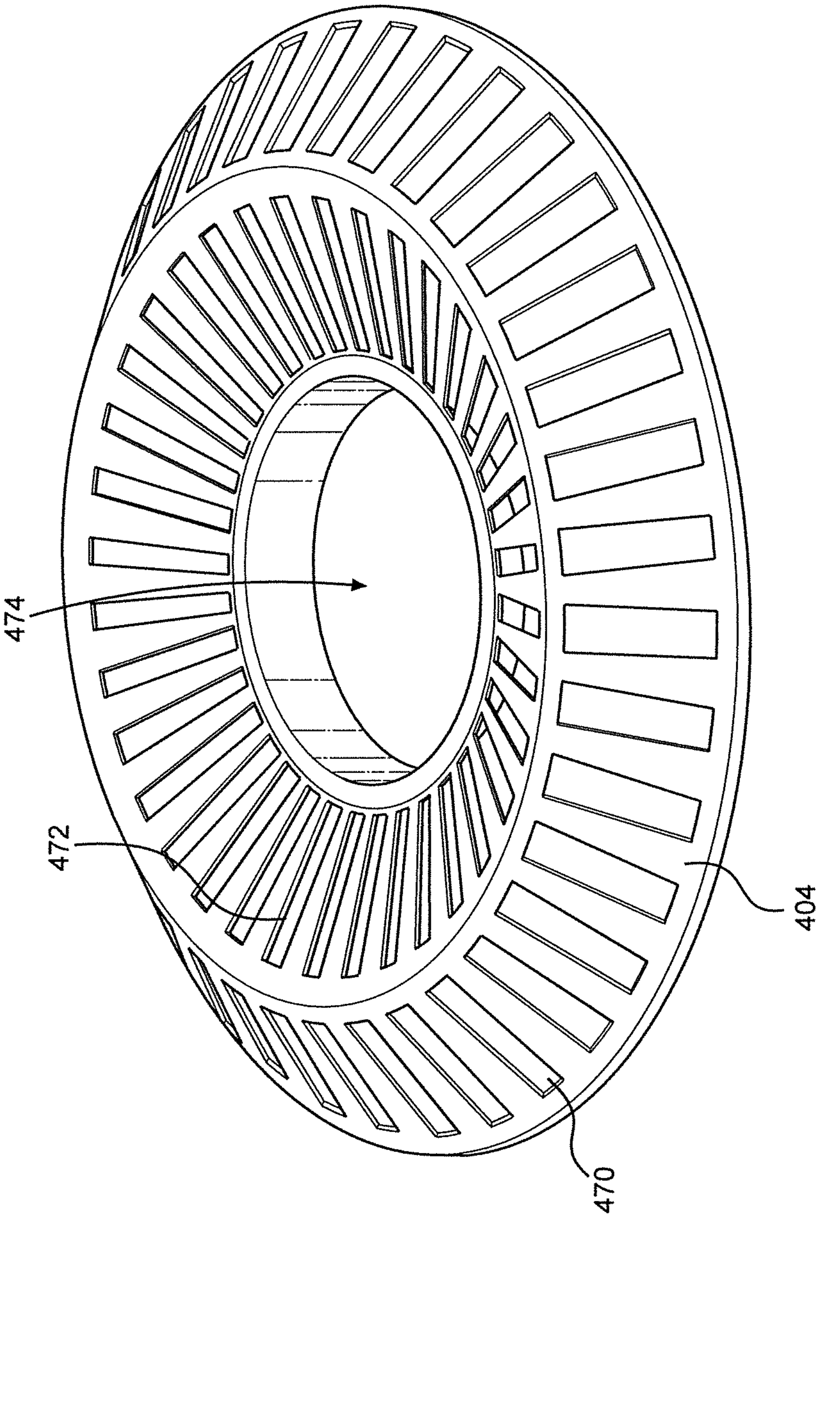
FIG. 18 schematically illustrates a view of just the frame or support from the assembly of FIG. 15.

FIG. 15 illustrates another antenna assembly 400. The antenna assembly 400 is for mounting on the upper surface of a vehicle 402, in which a portion of the outer surface of the vehicle is shown in the drawing figure. The antenna assembly 400 includes a support 404 and antenna tiles 406 disposed in the support. In FIG. 15, only a portion of the lower rim of the support 406 is visible. For greater clarity, FIG. 18 schematically illustrates a view of the support 406 with all other components removed.

Returning to FIG. 15, the antenna tiles 406 disposed in the support 404 form an external surface 408 corresponding substantially in shape to lateral faces of a frustum. The frustum includes a central axis with the antenna tiles 406 disposed around the central axis of the frustum and sloping away therefrom. As can be seen, the antenna tiles 406 are arranged in an annular configuration around a central axis with antenna tiles 406 sloping away from the central axis towards the vehicle 402. The slope relative to a horizontal plane passing through the base of the assembly 402 forms an acute angle between zero and ninety degrees, preferably between 30 and 70 degrees, more preferably between 40 degrees and 60 degrees. The antenna tiles 406 are for receiving a signal from a satellite in geostationary orbit, and orienting the tiles at a slope in the forgoing range tends to result in maximum gain for the tiles when the vehicle 402 traveling at mid-latitudes, i.e., between 40 and 60 degrees north or south latitude. In particular, most air traffic occurs in mid-latitudes.

Figure 16:
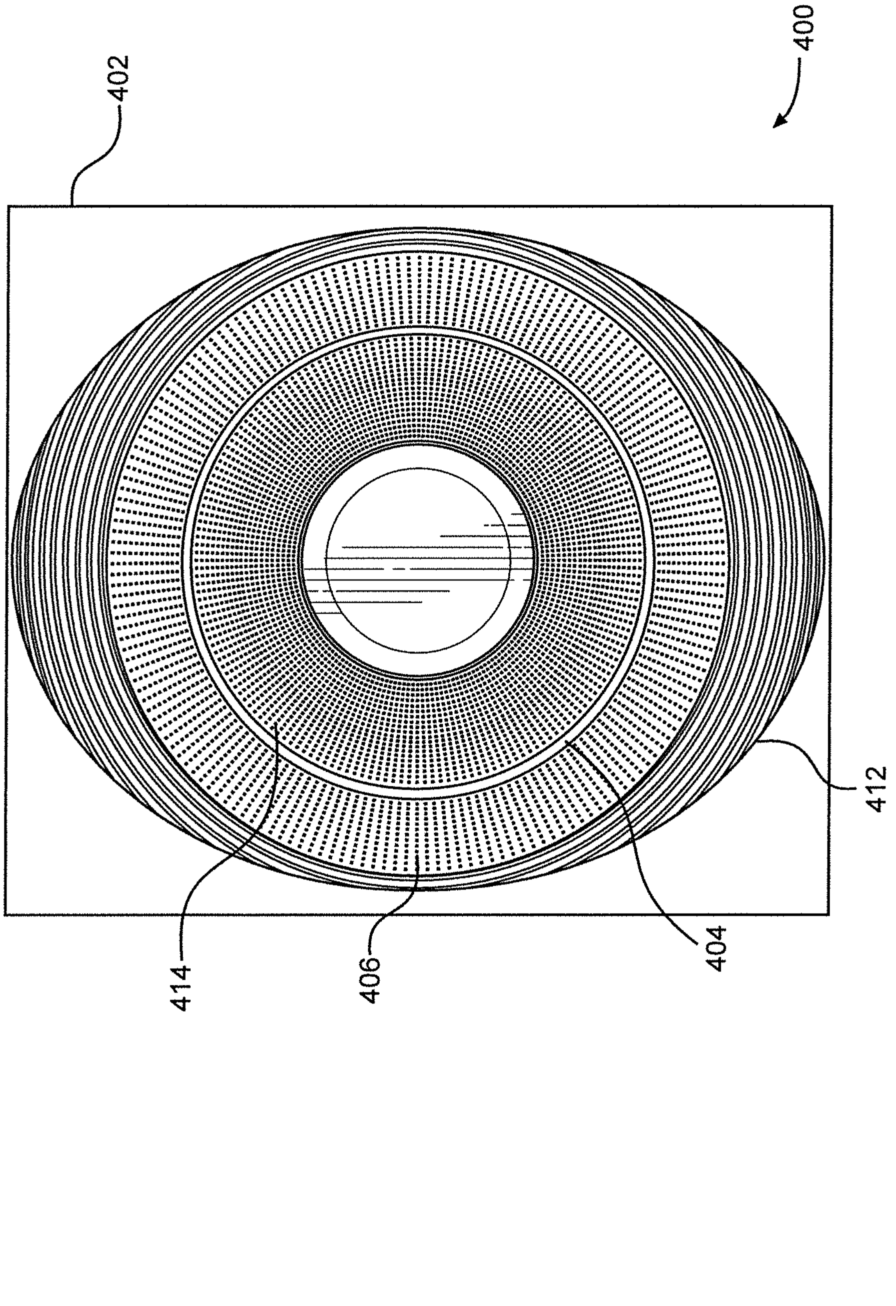
FIG. 16 is a schematic top view of the antenna assembly of FIG. 15 with the top or cap thereof removed.

The antenna assembly 400 further includes a top or cap 410 covering the apex of frustum, and the antenna tiles 406 extend around the apex of the frustum. There are sufficient tiles 406 provided to approximate a curved surface, i.e., preferably between 25 and 50 tiles, more preferably between 30 and 40. In FIG. 16, thirty six tiles 406 are provided by way of illustrative, non-limiting example.

Additionally illustrated in FIG. 15 is a mounting interface 412 disposed between the support 404 and the surface of the vehicle 402. The mounting interface 412 is shaped to conform to the vehicle surface to ensure a tight fit between the support 404 and the top of the vehicle 402. The mounting interface 412 includes fins 416 projecting upward, generally normal to the surface of the vehicle 402, to dissipate heat from the antenna assembly 400 to the surrounding environment. The mounting interface 412 is preferably formed of metal for good conduction, yet lightweight, such as titanium or aviation grade aluminum. The fins 416 are arranged generally edge-on to the aft and forward directions of the vehicle 402 for improved fluid flow between the fins and to promote aerodynamic efficiency. As illustrated, the fins are shown curved with the center of curvature concentric to the central axis of the frustum shape. Alternatively, the fins 416 may be straight and arranged parallel to the longitudinal axis of the vehicle 402 for greater aerodynamic efficiency.

FIG. 16 illustrates the antenna assembly 400 with the cap 410 removed to show the space under the cap 410 of the antenna assembly 400 and an inner group of antenna tiles 414. For convenient reference, the other antenna tiles 406 are referred to as an outer group of antenna tiles 406 extending around the top or apex of the frustum. In particular, the outer group of antenna tiles 406 are arranged in an annular configuration having an inner periphery. The inner group of antenna tiles 414 extend around the inner periphery of the outer group of antenna tiles, with the inner group of antenna tiles disposed between the support 404 and apex of the frustum, more precisely, between the support 404 and the cap 410. The cap 410 covers the inner group of antenna tiles 414 and leaves the outer group of antenna tiles 406 exposed to the environment surrounding the vehicle 402. This can be seen in FIG. 17, which schematically illustrates a portion of the antenna assembly 400 cut away and showing the cap 410 in place covering the inner group of antenna tiles 414 and leaving the outer group of antenna tiles 406 exposed.

The inner group of antenna tiles 414 slope upwardly away from the central of axis of the frustum, at an acute angle relative to a horizontal plane passing perpendicularly through the central axis of the frustum shape. The angle is preferably no more than 40 degrees, more preferably no more than 30 degrees, and yet more preferably the angle is around 20 degrees. The inner group of antenna tiles 414 are intended for transmitting a signal to a satellite in geostationary orbit. For a vehicle 402 traveling in mid-latitudes along the earth, foregoing described angle typically results in maximum ERIP (effective/equivalently isotropically radiated power). The upper edge of the outer group of tiles 406 lie proximate the upper edge of the inner group of tiles 414.

Figure 19:
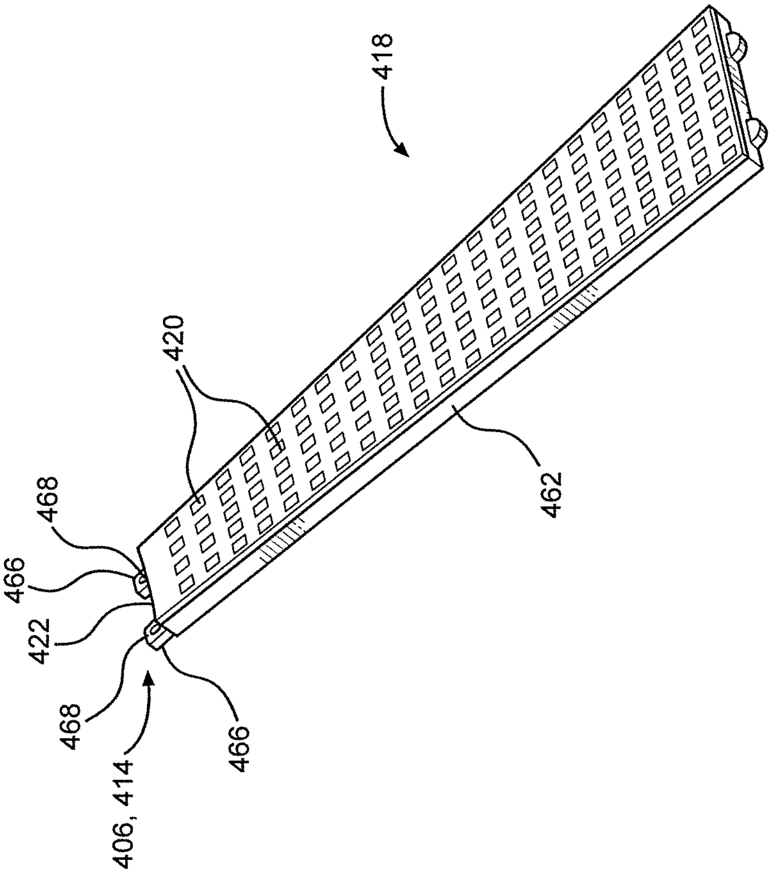
FIG. 19 schematically illustrates an individual antenna tile from the assembly of FIG. 15.

FIG. 19 schematically illustrates an individual antenna tile 406 or 414. Each antenna tile 406 and 414 includes a planar array 418 of antenna elements 420 disposed on the upper surface of the tile and configured to operate as a phased array. The antenna tiles 406 and 414 each include opposite ends 422 and 424, with one end narrower than the other end. In particular, the antenna tiles 406 and 414 each have a wedge or trapezoidal shape for improved coverage. The wedge or trapezoidal shape of the tiles 406 and 414 enables the tiles to fit closer together with smaller gaps between the tiles leaving less of the underlying support 404 exposed. The outer group of tiles 406 are arranged in the support 404, with each tile sloping downward from its narrower end 422 to the other, wider end 424. The inner group of tiles are arranged in the support 404 with the tile sloping upward from the narrower end 422 to the other, wider end 424.

The quantity of tiles 406 in the outer group and the quantity of tiles 414 in the inner group may be the same or different. However, a sufficient quantity of tiles 406 and 414 is preferably provided to approximate a curved surface. By way of illustrative, non-limiting example, the drawing figures show the outer group of tiles 406 being equal in quantity to that of the inner group of tiles 414. Since the inner group of tiles 414 form an annular configuration within the annular configuration of the outer group of tiles 404, each tile 414 of the inner group has a smaller base dimension relative to a tile 404 of the outer group.

The previously described antenna assemblies 100 and 102 are sized and shaped to mount the assembly 400 to mounts provided an aircraft generally in accordance with the ARINC 791 standard. As previously described, the ARINC 790 standard provides for a maximum width of 1121.2 mm (see FIG. 3). The antenna assembly 400 of FIG. 15, however can have a slightly larger width because the outer group of tiles 406 are preferably left exposed to the external environment and not enclosed under a radome. Hence, space normally required to accommodate the radome becomes available to enlarge the diameter of the bottom of the assembly 400 up to a maximum of 1200 mm for wide body aircraft.

In an assembly 400 comprised of 36 tiles 406 in the outer group, the wider end 424 of each tile 406 combine to form a 36 sided regular polygon, viewed from above as in FIG. 16. If the assembly has a diameter of 1200 mm, the wider end of each tile 406 can be 105 mm at maximum. As there is a small space between each tile 406, the maximum dimension of the wider end of each tile 406 is preferably between 104 mm and 105 mm, and more preferably in between those two dimensions, depending on manufacturing tolerances. For greater aerodynamic efficiency, the assembly 400 preferably has a low profile, with a height no greater than six inches, and more preferably around five inches or less.

Figure 20:
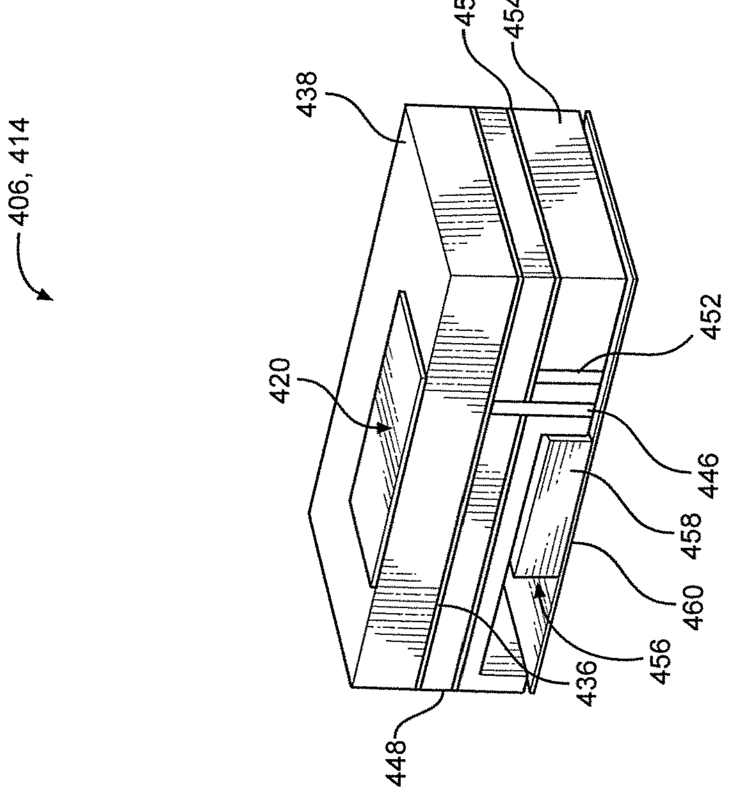
FIG. 20 schematically illustrates a perspective partial cross-sectional view of an antenna tile of FIG. 15, taken along an antenna element.
Figure 21:
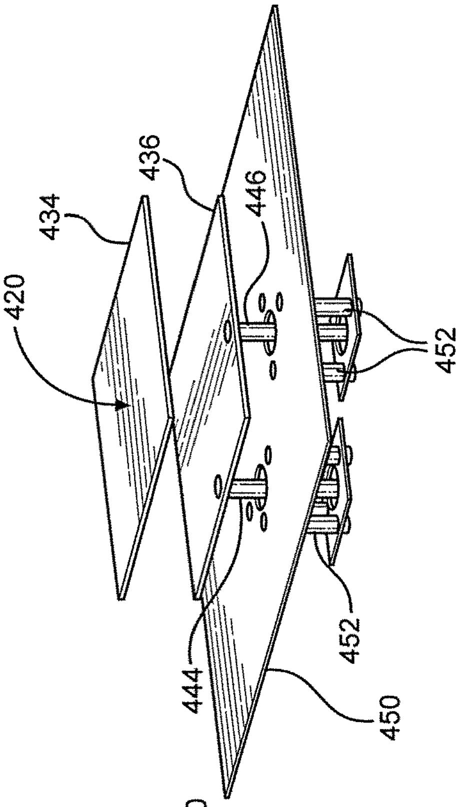
FIG. 21 schematically illustrates patch elements removed from an antenna element.

FIG. 20 schematically illustrates a perspective partial cross-sectional view of a tile 406 or 414 taken along an antenna element 420. For ease of manufacturing, the antenna elements 420 are preferably square patch elements 434 and 436 formed of metal, and stacked for greater bandwidth. For greater clarity, FIG. 21 schematically illustrates the patch elements 434 and 436 removed from an antenna element 420. The upper patch 434 in the stack is a floating patch provided for impedance matching of air. In this regard, the floating patch forms the upper surface of the antenna element 420. The floating patch 434 is electrically insulated from the lower patch 436 by a substrate 438 having high electrical resistance. Vias 444 and 446 respectively connect the lower patch 438 to horizontal and signal inputs or outputs, depending on whether the tile 406 or 414 is for reception or transmission of signals. The patch elements 434 and 436 have square sides, preferably in a range from 4 mm to 7 mm in length, more preferably towards the upper end of the range for tiles 406 for reception and closer to the lower end of the range for tiles 414 for transmission.

Another substrate 448 electrically insulates the lower patch 46 from a ground patch 450. The ground patch 450 electrically connects to ground through vias 452, and is supported on a substrate layer 454. The substrate layer 454 has formed therein a space or cavity 456 in which an RFIC (radio frequency integrated circuit) 458 is mounted. An RFIC 458 is provided for each antenna element 420, in which the RFIC provides the horizontal and vertical signals to the vias 444 and 446.

The substrates 438, 448, and 454 are preferably formed of antenna grade laminates and materials suitable for multi-layer high frequency use. Suitable material are available from the Rogers Corporation of Chandler, Ariz., USA, in particular, materials sold under the trademarks RO4700 series, RO4350B, and RO4450B. The bottommost layer 460 of each tile 406 and 414 is a heatsink and formed of a metal, such as aluminum for conducting heat away from the RFIC 458.

Returning to FIG. 19, each antenna tile 406 and 414 includes a metal frame 462 disposed around the side edges of each tile 406 and 414. The metal frame 462 includes feet or ribs 464 along the wider end 424 of the tile 406 or 414, projecting outward therefrom along the plane of the tile. The narrower end of the tile 406 or 414 has feet or ribs 466 projecting outwardly in the opposite direction, with an aperture 468 disposed in each. The apertures 468 are for receiving a fastener therein for fastening the tile 406 or 414 to the support 404. In this way, each tile 406 and 414 is may be easily removed and replaced should it malfunction. Hence, each tile 406 and 414 may function as a line replaceable unit (LRUs).

Figure 22:
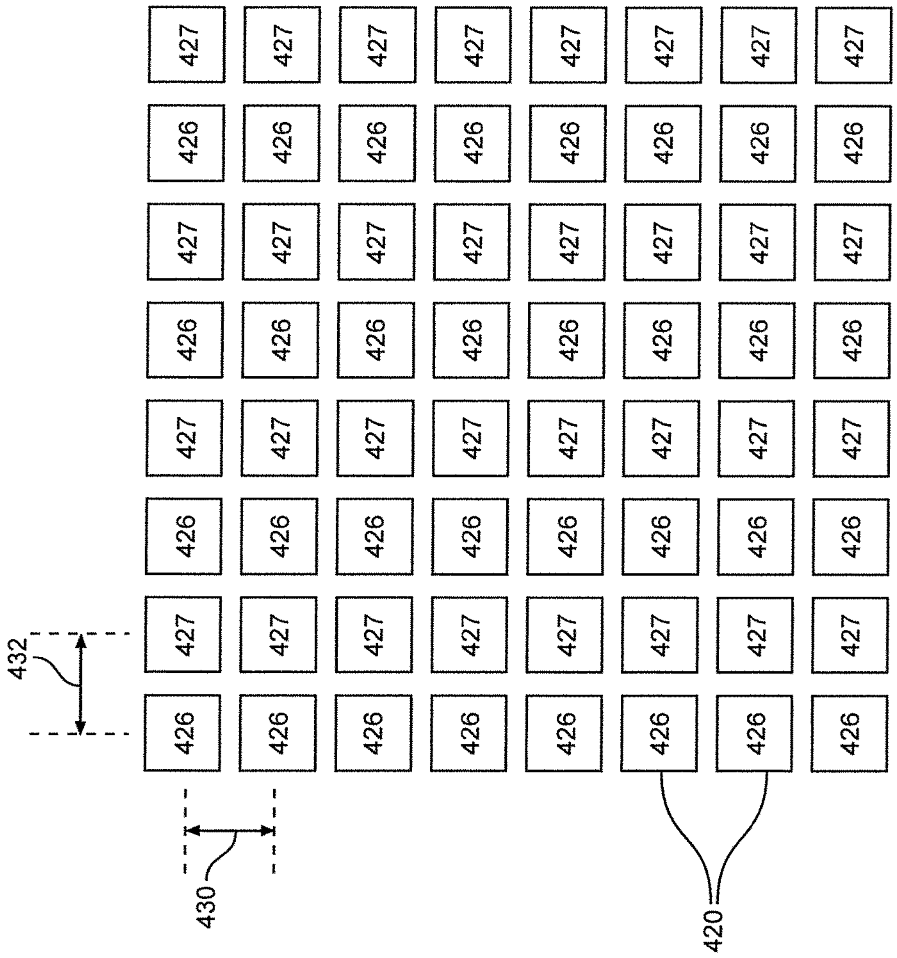
FIG. 22 schematically illustrates antenna elements of an antenna tile divided into a first and second array.

The antenna elements 420 on each tile 406 and 414 are divided into first and second arrays 426 and 427 as schematically illustrated in FIG. 22. The first array 426 may be used to form one antenna beam, while the other array 427 may be used to form another beam, which each beam used for communication with a different satellite. Alternatively, each beam is used for communication with the same satellite for increased bandwidth. In addition, the tiles 406 and 414 and arrays 426 and 427 can be controlled to have different polarizations from one another. By way of illustrative non-limiting example, the one array 426 or 427 can be controlled to have horizontal polarization, the other array controlled to have vertical polarization, while the arrays 426 and 427 of another tile 406 or 414 has circular polarization.

As shown in FIG. 22, the antenna elements 420 of each array 426 and 427 alternate with one another. In this way the full width and length of each tile 406 or 414 is used to minimize the width of the resulting beam and help to prevent encompassing more than one satellite within the beam. The antenna elements 420 of each tile are preferably spaced from the center of one element 420 to the center of an adjacent element 420 in accordance with the wavelength of the band. In particular, the spacing 430 from the center of one row to the next row is preferably from 0.25 of the wavelength to around 0.75 of wavelength of the frequency band, more preferably from around 0.30 to 0.60 of the wavelength, and more preferably yet, from around 0.35 to 0.55 of the wavelength. For a tile 406 used for receiving signals in the Ku band, i.e., frequencies from 10.70 GHz to 12.75 GHz, the spacing 430 may be in a range from 10 mm to 14 mm, and more preferably therebetween, e.g., around 12 mm. Since the width of each tile 406 is less than its length, the spacing from the center of each column to the next may be slightly smaller, i.e., in a range from 8 mm to 12 mm, and more preferably in between those values, e.g., around 10 mm.

FIG. 18 schematically illustrates a view of the frame or support 404 removed from the rest of the assembly 400. The support 400 is preferably formed of composite materials using a resin transfer molding (RTM) process for a higher strength-to-weight ratio. Composite materials do not include metal and reduce interference with receipt and transmission of signals. As can been in FIG. 18, the support 404 provides a recess 470 corresponding to each tile 406 of the outer group of tiles. The support 404 further provides a recess 472 corresponding to each tile 414 of the inner group. Each recess 470 and 472 permits its respective tile 404 and 414 to seat therein and form a smooth surface in cooperation with the non-recesses portions of the support 404.

Figure 17:
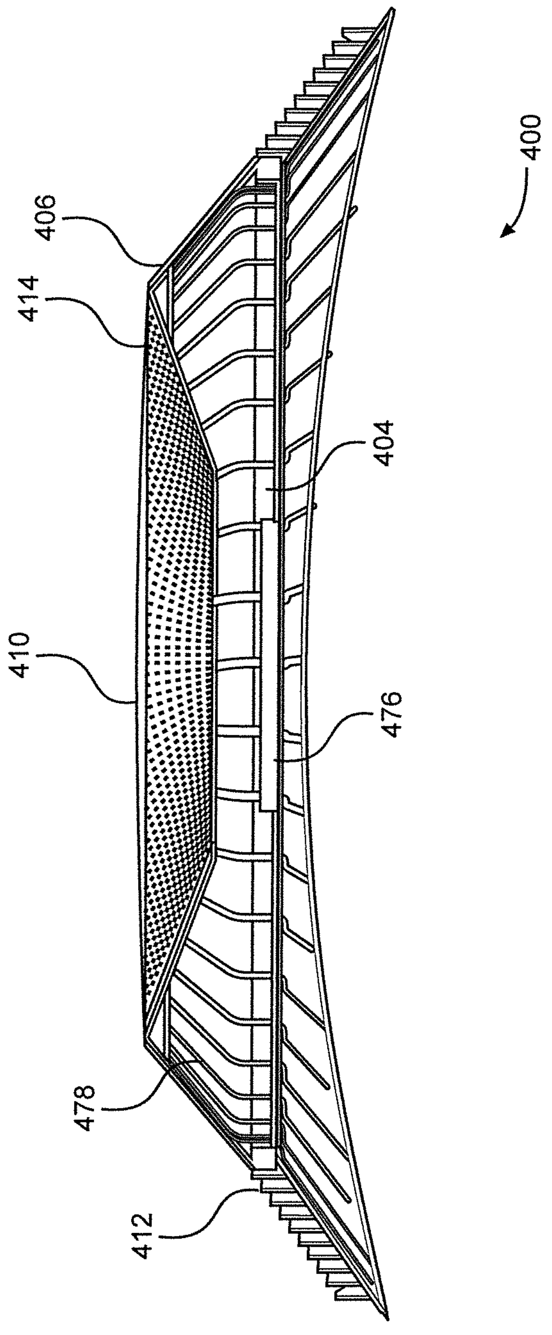
FIG. 17 schematically illustrates a portion of the antenna assembly of FIG. 15 cut away and showing the top or cap in place.

The center the support 404 provides a central annular opening 474 for mounting of electronics 476 (see FIG. 17) for control of the tiles 404 and 414. A cable connects from the electronics 476 to each tile 404 and 414 for providing power and data communication. The control may be as described previously in connection assemblies 100 and 102. With reference to FIG. 17, a heat conduction path 478 passes under each tile 404 and 414 to the fins 412. The conduction paths 478 are formed of a metal for good heat conduction for transferring heat from the tiles 404 and 412 to the fins 412, and from the fins to the surrounding environment.

Tiles 414 used for transmission in the Ku band, must transmit signals in a frequency range from 14 GHz to 14.5 GHz. The wavelengths are therefore shorter, and so are the spacings 430 and 432 in FIG. 22. In particular, the spacing 430 between the center of one row and the next is in a range from 8 mm to 12 mm, and more preferably there between, i.e., around 10 mm. The spacing 432 between the center of one column and the next is in a range from 10 mm to 14 mm, and more preferably therebetween, i.e., around 12 mm.

Figure 23:
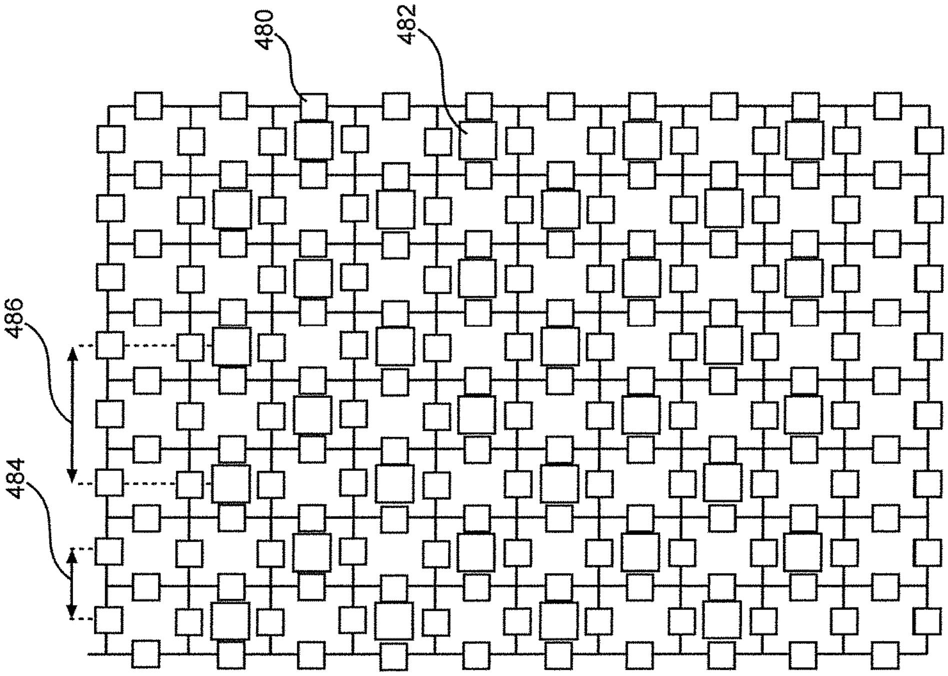
FIG. 23 illustrates an alternative array arrangement for antenna tiles divided into first and second arrays for communicating in different bands.

FIG. 23 illustrates an alternative array arrangement for a tile to communicate in different bands, such as Ku and Ka. Smaller patch elements 480 spaced closer together at spacing 484 for accommodating one band. Larger patch elements 482 are inserted among the smaller patch elements at a greater spacing 486 from one another to accommodate a different band.

Various changes and modifications can be made to the described embodiments without departing from the scope of the invention as will be recognized by those of ordinary skill in the art. For example, while antenna assemblies have been described respectively for transmission and reception, a single assembly could be provided for providing both transmission and reception as the transmission and reception frequencies are different. The antenna assemblies 100 and 102 could be provided of the same size, the aft and forward positions reversed, or the transmission antenna assembly made larger than the antenna assembly for reception. In the assembly 400, different quantities of tiles for reception and transmission could be provided, rather than equal quantities of each. Alternatively, in the assembly 400 with equal quantities of tiles 406 and 414, each tile 406 and 414 could be could combined into a single tile joined along one edge, instead of separately to enable easier assembly of the tiles onto the support. Antenna tiles may be designed to operate in bands other than Ku and Ka, such as the C band for example. Different tile shapes could be provided, or a mixture of tile shapes provided, with different quantities of antenna elements.

As changes can be made as described, the present examples and described configurations are to be considered as illustrative and not restrictive and the invention is not to be limited to the details given herein, but may be modified within the scope and equivalence of the appended claims.

The invention claimed is:

1. An antenna assembly comprising:

a support;

antenna tiles disposed in the support in which the antenna tiles form an external surface corresponding substantially in shape to lateral faces of a frustum, the frustum including a central axis with the antenna tiles disposed around the central axis of the frustum and sloping away therefrom, each antenna tile including opposite ends with one end narrower than the other end;

a planar array of antenna elements disposed on each antenna tile in which the antenna elements of each array are configured to operate as a phased array; and a control system connected to the planar arrays of antenna elements in which the control system is configured to selectively activate and deactivate each of the planar arrays wherein the antenna assembly is for mounting on top of a vehicle for supporting communication with a satellite, and wherein each antenna the include opposite ends, with one end of the tile narrower than the other end, and the tiles slope downward towards the vehicle from the narrower end of the tile to the opposite end of the tile.

2. The antenna assembly of claim 1, further comprising inner antenna tiles, the inner antenna tiles being disposed between the central axis and the antenna tiles of the external surface.

3. The antenna assembly of claim 2, further comprising a cap covering the inner antenna tiles, and leaving antenna tiles of the external surface exposed.

4. The antenna assembly of claim 1, wherein the tiles comprise opposing PCB substrates with a plurality of RFICs disposed between the PCB substrates.

5. The antenna assembly of claim 1, wherein each antenna tile is configured to be controlled as an individual scanning array by activating the planar array of antenna elements disposed on the tile.

6. The antenna assembly of claim 1, wherein the antenna elements of each planar array include at least two groups of antenna elements configured to be controlled separately with each group as an individually controllable phased array.

7. An antenna assembly for mounting on a vehicle for supporting communication with a satellite, the antenna assembly comprising:

a support;

an outer group of antenna tiles disposed in the support in which the antenna tiles form an external surface corresponding substantially in shape to lateral faces of a frustum, the frustum including an apex with the antenna tiles of the outer group extending around the apex of the frustum, and the outer group of antenna tiles including an inner periphery;

an inner group of antenna tiles extending around the inner periphery of the outer group of antenna tiles, with the inner group of antenna tiles disposed between the support and the apex of the frustum;

a planar array of antenna elements disposed on each antenna tile of the inner and outer groups of antenna tiles in which the antenna elements of each array are configured to operate as a phased array; and a control system connected to the planar arrays of antenna elements in which the control system is configured to selectively activate and deactivate each of the planar arrays;

wherein each antenna tile of the outer and inner groups has opposite ends, with one end narrower than the other end.

8. The antenna assembly of claim 7, further comprising a cap covering the apex of the frustum, with the inner cap covering the inner group of antenna tiles and leaving the outer group of antenna tiles exposed.

9. The antenna assembly of claim 7, wherein the antenna elements of each planar array include at least two groups of antenna elements configured to be controlled with the groups having polarizations different from one another.

10. The antenna assembly of claim 7, wherein the narrower end of each of the outer group of tiles is disposed farther away from the vehicle than the opposite end of the tile, and the narrower end of each of the inner group of tiles is disposed closer to the vehicle than the other of the tile.

11. The antenna assembly of claim 7, wherein each antenna element of the outer group of tiles comprises first and second patches, with one patch disposed under the other.

12. The antenna assembly of claim 7, wherein the tiles comprise opposing PCB substrates with a plurality of RFICs disposed between the PCB substrates.

13. An antenna assembly for mounting on a vehicle for supporting communication with a satellite, the antenna assembly comprising:

antenna tiles arranged in an annular configuration around a central axis with the antenna tiles sloping away from the central axis towards the vehicle;

a support including a recess corresponding to each antenna tile in which each tile seats in its corresponding recess;

a planar array of antenna elements disposed on each antenna tile in which the antenna elements of each array are configured to operate as a phased array;

a control system connected to the planar arrays of antenna elements in which the control system is configured to selectively activate and deactivate each of the planar arrays; and wherein each antenna tile is substantially identical to one another.

14. The antenna assembly of claim 13, further comprising an inner annular configuration of antenna tiles disposed around the central axis, the inner configuration being disposed between the central axis and the other annular configuration.

15. The antenna assembly of claim 13, wherein the antenna elements of each planar array include at least two groups of antenna elements configured to be controlled separately with each group as an individually controllable phased array.

16. The antenna assembly of claim 15, wherein the individually controllable phased arrays are configured to be operable to support communication with two different satellites simultaneously, or operable to support communication via at least two beams with a single satellite.

17. The antenna assembly of claim 13, further comprising a cover disposed over the inner annular configuration and leaving the other annular configuration exposed.

18. The antenna assembly of claim 1, wherein each tile comprises PCB layers having RFICs disposed the layers.

19. The antenna assembly of claim 13, wherein the annular configuration has a diameter no greater than 1200 mm.

20. The antenna assembly of claim 13, the antenna assembly further comprising a base and said antenna tiles sloping away from the central axis towards the vehicle at an acute angle relative to a horizontal plane passing through the base.

* * * * *